(12) United States Patent
Shin et al.

(10) Patent No.: US 9,847,489 B1
(45) Date of Patent: Dec. 19, 2017

(54) POLYMER, METHOD OF PREPARING THE SAME, AND ORGANIC OPTOELECTRIC DEVICE INCLUDING THE SAME

(71) Applicant: KOREA RESEARCH INSTITUTE OF CHEMICAL TECHNOLOGY, Daejeon (KR)

(72) Inventors: Won Suk Shin, Daejeon (KR); Changeun Song, Busan (KR); Sang Kyu Lee, Daejeon (KR); Jong Cheol Lee, Daejeon (KR); Sang Jin Moon, Daejeon (KR); Hoang Quoc Viet, Daejeon (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 15/371,765

(22) Filed: Dec. 7, 2016

(30) Foreign Application Priority Data

Sep. 9, 2016 (KR) .......... 10-2016-0116444
Nov. 28, 2016 (KR) .......... 10-2016-0159227

(51) Int. Cl.
| | | |
|---|---|---|
| H01L 51/00 | (2006.01) | |
| C08G 61/12 | (2006.01) | |
| C07F 7/08 | (2006.01) | |
| H01L 51/42 | (2006.01) | |
| H01L 51/44 | (2006.01) | |

(52) U.S. Cl.
CPC ........ *H01L 51/0036* (2013.01); *C07F 7/0814* (2013.01); *C07F 7/0827* (2013.01); *C08G 61/126* (2013.01); *H01L 51/0043* (2013.01); *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/3241* (2013.01); *C08G 2261/3246* (2013.01); *C08G 2261/91* (2013.01); *H01L 51/0003* (2013.01); *H01L 51/0004* (2013.01); *H01L 51/0005* (2013.01); *H01L 51/0026* (2013.01); *H01L 51/4253* (2013.01); *H01L 51/4273* (2013.01); *H01L 51/442* (2013.01)

(58) Field of Classification Search
CPC .................. H01L 51/0036; C08G 61/126
See application file for complete search history.

(56) References Cited

FOREIGN PATENT DOCUMENTS

KR   10126551100 B1   5/2013

OTHER PUBLICATIONS

Jo et al., Energy Environ. Sci., 2015, 8, 2427 (Year: 2015).*
Kazuaki Kawashima, et al; "Implication of Fluorine Atom on Electronic Properties, Ordering Structures, and Photovoltaic Performance in Naphthobisthiadiazole-Based Semiconducting Polymers", Journal of the American Chemical Society, Published Jul. 22, 2016; vol. 138, pp. 10265-10275.

* cited by examiner

*Primary Examiner* — Liam J Heincer
(74) *Attorney, Agent, or Firm* — Ladas & Parry LLP; Loren K. Thompson

(57) ABSTRACT

Provided are a novel polymer, a method of preparing the same, and an organic semiconductor device including the same. According to the present invention, the fluorine content-controlled polymer is employed in an organic active layer, thereby providing an organic optoelectric device representing improved power conversion efficiency (PCE).

11 Claims, 5 Drawing Sheets

POLYMER, METHOD OF PREPARING THE SAME, AND ORGANIC OPTOELECTRIC DEVICE INCLUDING THE SAME

CROSS-REFERENCE TO RELATED APPLICATIONS

This application claims priority under 35 U.S.C. §119 to Korean Patent Application No. KR2016-0116444, filed on Sep. 9, 2016, in the Korean Intellectual Property Office, the disclosure of which is incorporated herein by reference in its entirety.

TECHNICAL FIELD

The following disclosure relates to a novel polymer, a method of preparing the same, and an organic optoelectric device including the same, and more particularly, to a polymer having excellent oxidation stability by including specific, fluorine-controlled repeating units, and having high charge carrier mobility by intermolecular stacking, a method of preparing the same, and an organic optoelectric device including the same.

BACKGROUND

Generally, an organic optoelectric device is a device requiring alternating current of charges between an electrode and an organic matter using holes or electrons.

An organic optoelectric device may be classified into a type in which excitons are formed in an organic layer by photons introduced to the device from an external light source according to an operation principle, and then separated into electrons and holes, and each of these electrons and holes is transferred to other electrode, and used as a current source (voltage source), and a type in which voltage or current is applied to two or more electrodes to inject holes or electrons into an organic semiconductor forming an interface with the electrodes, and operation is performed by the injected electrons or holes.

As an example of the organic optoelectric device, an organic photoelectric device, an organic light-emitting device, an organic solar cell, an organic photoconductor drum, an organic transistor and the like are mentioned, and all of these require an injection or transport material of holes, an injection or transport material of electrons, or a luminescent material for driving the device.

Among these, the organic solar cell is composed of a joint structure of the materials of a hole acceptor and an electron acceptor, and when visible light is absorbed, electron-hole pairs are produced in the hole acceptor, and electrons are transferred to the electron acceptor, so that the electron-hole is separated, and thus, by this process, a photovoltaic effect is shown.

In particular, since an organic thin film solar cell using a high molecule has merits of a low unit cost of production and allowing a freely bendable, flexible device to have a large area, as compared with an inorganic solar cell using silicone, a lot of researches on this are in progress, as in Patent Document 1.

Meanwhile, as a representative material used in a photo-conversion active layer of an organic thin film solar cell, poly(3-hexylthiophene) (P3HT) may be mentioned, and it was reported that when it was manufactured into a device with a C60 fullerene derivative having a high electron affinity, efficiency of about 4-5% was shown.

However, P3HT has demerits such as a light absorption region being limited, and thus, in order to overcome these demerits and manufacture a highly efficient organic thin film solar cell, there is a demand for development of a novel high molecule having a low band gap of a large light absorption region, excellent hole mobility, and an appropriate molecular level.

RELATED ART DOCUMENT

Patent Document (Patent Document 1) KR 10-1265511 B1 (publication date: Nov. 14, 2012)

SUMMARY

An embodiment of the present invention is directed to providing a polymer including fluorine-controlled, specific repeating units having a highly efficient photoelectric conversion property by improving a transfer property of a charge carrier through improved solubility and effective intermolecular stacking of a planar molecular structure, and a method of preparing the same.

Another embodiment of the present invention is directed to providing an organic optoelectric device in which the above described polymer is employed in an organic active layer.

According to the present invention, a polymer having an excellent photoelectric conversion property is provided by including fluorine-controlled, specific repeating units to have more improved oxidation stability, and having high charge carrier mobility by intermolecular stacking. Further, a fluorine-controlled repeating unit represented by the following Chemical Formula 2 according to the present invention may be polymerized with repeating units including various electron donors and electron acceptors, to provide a novel highly efficient photoelectric conversion polymer.

In one general aspect, a polymer includes repeating units represented by the following Chemical Formulae 1 and 2:

[Chemical Formula 1]

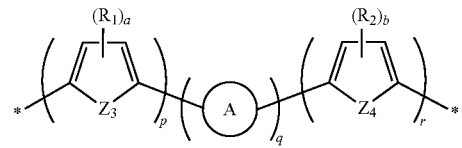

[Chemical Formula 2]

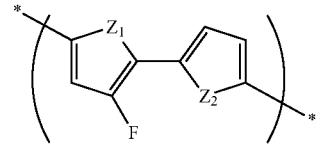

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-C30)heteroaryl;

A is a fused ring system organic radical of heteroarylene selected from the group consisting of furylene, thiophenylene, pyrrolylene, imidazolylene, pyrazolylene, thiazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene, pyridazinylene and the like, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —C(=O)—, —Si— and P;

a and b are independently of each other an integer of 0 to 2, and when a and b are 2, $R_1$ and $R_2$ are identical to or different from each other;

p and r are independently of each other an integer of 0 to 3; and q is an integer of 1 to 5.

To the repeating unit represented by the above Chemical Formula 1 according to one exemplary embodiment of the present invention, various substituents may be introduced so that an electron donor (p-type) or electron acceptor (n-type) is included, thereby improving the solubility and oxidation stability of a polymer derived therefrom.

A of the repeating unit represented by the above Chemical Formula 1 according to an exemplary embodiment of the present invention may be preferably a benzo-fused ring system organic radical such as benzofuranylene, benzothiophenylene, isobenzofuranylene, benzimidazolylene, benzothiazolylene, benzisothiazolylene, benzisoxazolylene, benzoxazolylene, benzoxadiazolylene, isoindolylene, indolylene, indazolylene, benzothiadiazolylene, quinolylene, isoquinolylene, cinnolinylene, quinazolinylene, phenanthridinylene, benzodioxolylene, dibenzofuranylene, dibenzothiophenylene, thiadiazolopyridinylene and thiadiazolonaphthothiadiazolylene, or a pyrrole-fused ring system organic radical such as pyrroloimidazolylene, pyrrolopyrazolylene and pyrrolopyrrolidonylene, in terms of having a high molecular extinction coefficient and a broad absorption wavelength, and the fused ring system organic radical may be, of course, further substituted by one or more substituents selected from the group consisting of halogen, hydroxy, cyano, (C1-C7)alkyl, (C1-C7)alkoxy, (C6-C12)aryl, (C6-C12)ar(C1-C7)alkyl and the like.

The polymer according to an exemplary embodiment of the present invention includes repeating units represented by the following Chemical Formulae 1 and 2, and each repeating unit may be alternately or randomly polymerized one.

In another general aspect, a method of preparing the above described polymer includes the following.

Specifically, a polymer represented by the following Chemical Formula 3 according to an exemplary embodiment of the present invention may be prepared by reacting a compound represented by the following Chemical Formula 4 and a compound represented by the following Chemical Formula 5:

[Chemical Formula 3]

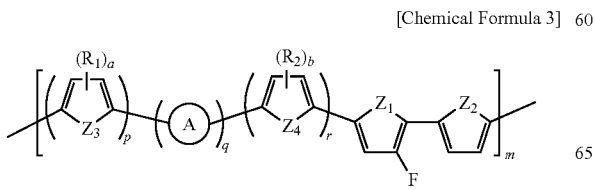

[Chemical Formula 4]

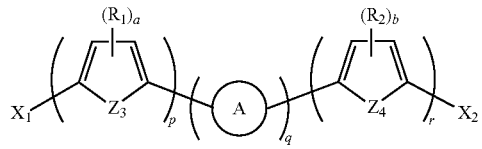

[Chemical Formula 5]

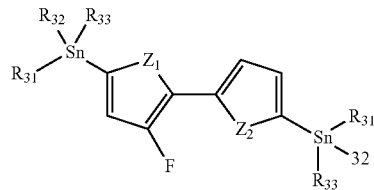

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-C30)heteroaryl;

$R_{31}$ to $R_{33}$ are independently of one another hydrogen or (C1-C30)alkyl;

A is a fused ring system organic radical of heteroarylene selected from the group consisting of furylene, thiophenylene, pyrrolylene, imidazolylene, pyrazolylene, thiazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene and pyridazinylene, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —Si— and P;

$X_1$ and $X_2$ are independently of each other halogen;

m is an integer selected from 2 to 1,000;

a and b are independently of each other an integer of 0 to 2, and when a and b are 2, $R_1$ and $R_2$ are identical to or different from each other;

p and r are independently of each other an integer of 0 to 3; and q is an integer of 1 to 5.

In another general aspect, an organic optoelectric device includes the above described polymer. The organic optoelectric device may be selected from the group consisting of an organic light emitting device, an organic solar cell, an organic photoconductor (OPC), an organic memory, an organic transistor and the like, but not limited thereto.

Other features and aspects will be apparent from the following detailed description, the drawings, and the claims.

DETAILED DESCRIPTION OF EMBODIMENTS

Figure 1:
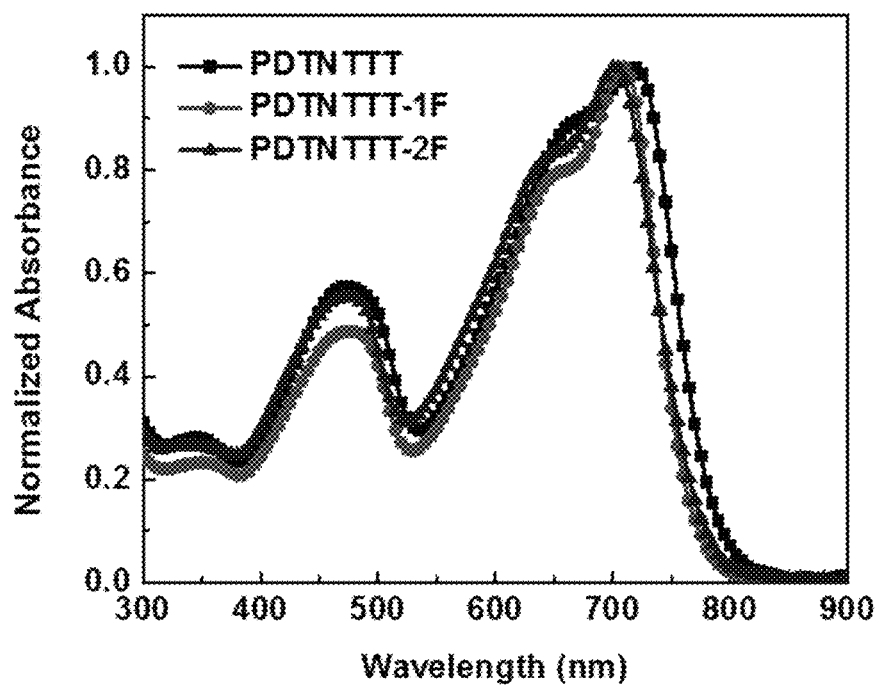
FIG. 1 is a UV absorption spectra on a solution of the polymers prepared in Example 1, and Comparative Examples 1 and 2 of the present invention.
Figure 2:
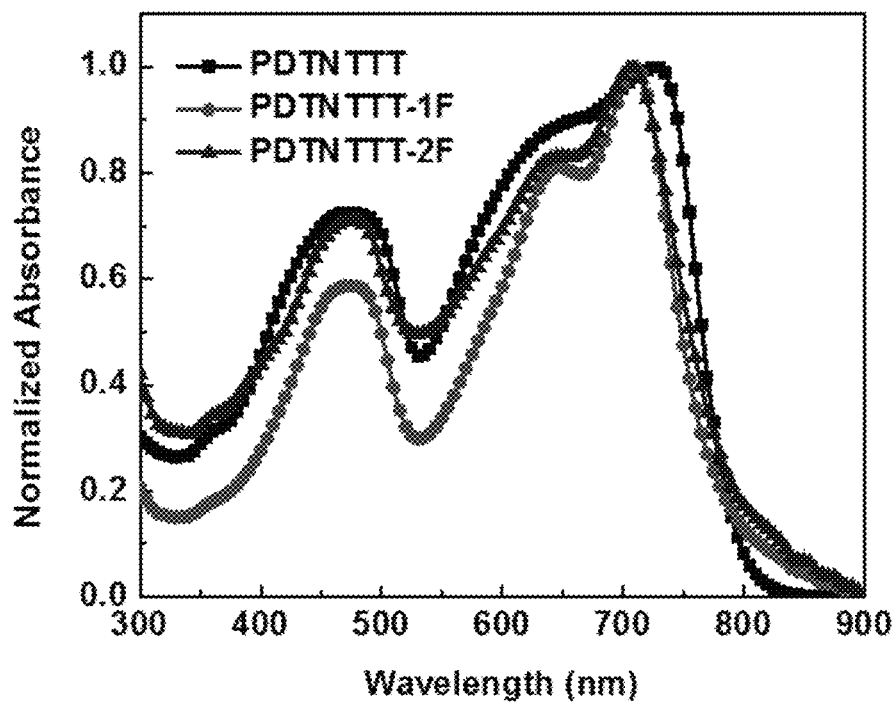
FIG. 2 is a UV absorption spectra on a film of the polymers prepared in Example 1, and Comparative Examples 1 and 2 of the present invention.
Figure 3:
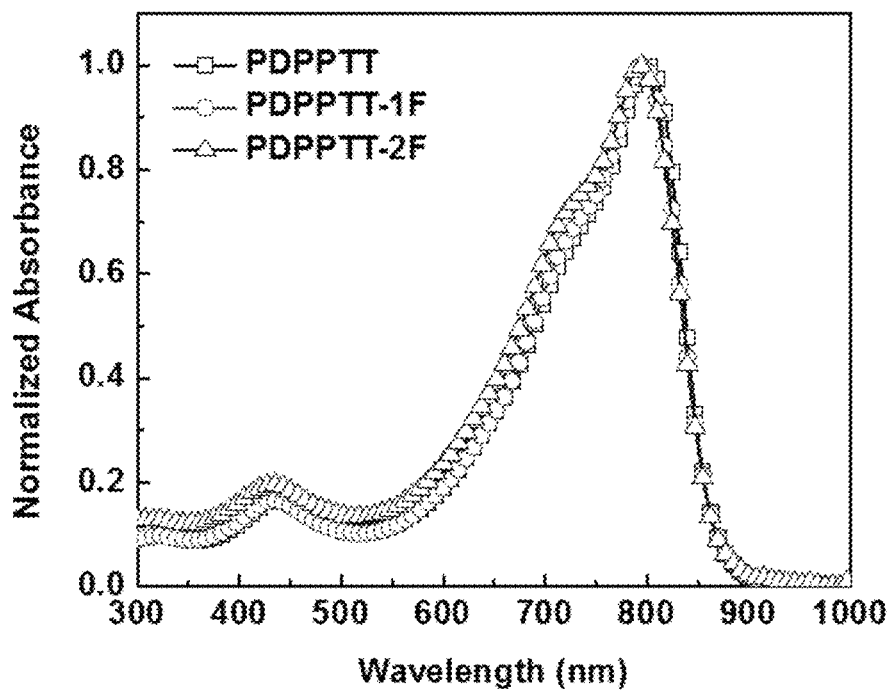
FIG. 3 is UV absorption spectra on a solution of the polymers prepared in Example 2, and Comparative Examples 3 and 4 of the present invention.
Figure 4:
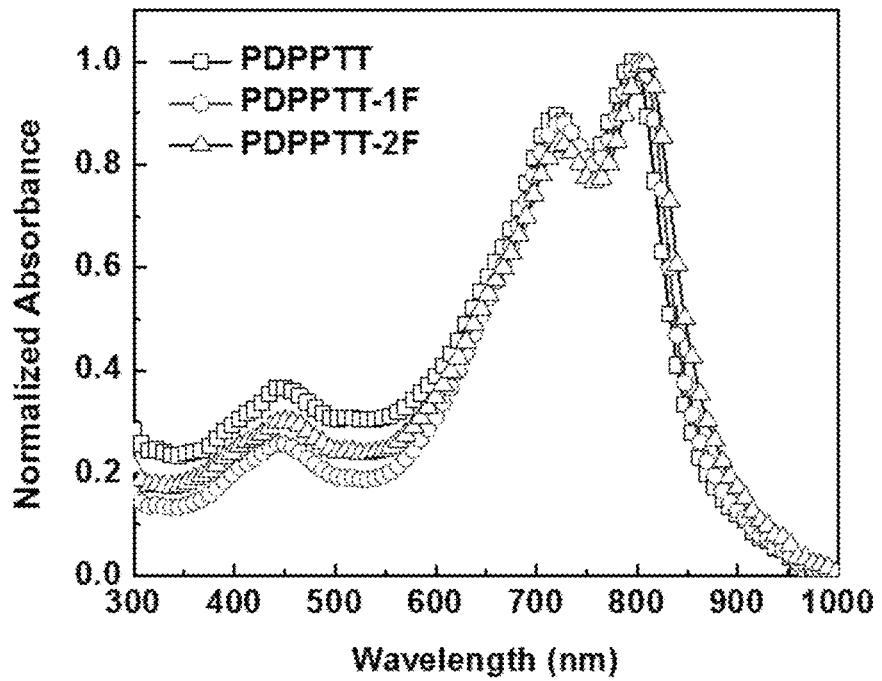
FIG. 4 is UV absorption spectra on a film of the polymers prepared in Example 2, and Comparative Examples 3 and 4 of the present invention.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a novel polymer, a method of preparing the same, and an organic optoelectric device including the same, according to the present invention will be described, however, technical terms and scientific terms used herein have the general meaning understood by those skilled in the art to which the present invention pertains unless otherwise defined, and a description for the known function and configuration obscuring the present invention will be omitted in the following description.

The present inventors found out that by including a fluorine-controlled, specific repeating unit, the chemical properties of a polymer such as solubility and oxidation stability may be surprisingly improved, and high charge carrier mobility may be derived by intermolecular stacking, thereby completing the present invention.

Further, in the present invention, the fluorine-controlled, specific repeating unit may be synthesized by a relatively simple process, and a novel preparation method to highly selectively obtain this repeating unit is intended to be provided.

The polymer including a fluorine-controlled specific repeating unit according to the present invention may be polymerized with repeating units containing an appropriate electron donor or electron acceptor, thereby providing a highly efficient organic optoelectric device at a stable HOMO (highest occupied molecular orbital) or LUMO (lowest occupied molecular orbital) level by using an intramolecular interaction. In particular, according to the present invention, the polymer shows a stable photoelectric conversion property, and may be usefully used as an organic optoelectric device having the excellent efficiency.

The polymer according to an exemplary embodiment of the present invention may include the repeating units represented by the following Chemical Formulae 1 and 2:

[Chemical Formula 1]

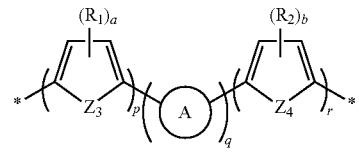

[Chemical Formula 2]

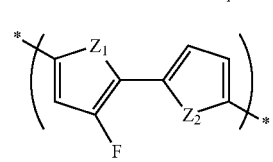

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-O30)heteroaryl;

A is a fused ring system organic radical of heteroarylene selected from the group consisting of furylene, thiophenylene, pyrrolylene, imidazolylene, pyrazolylene, triazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene, pyridazinylene and the like, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —C(=O)—, —Si— and P;

a and b are independently of each other an integer of 0 to 2, and when a and b are 2, $R_1$ and $R_2$ are identical to or different from each other;

p and r are independently of each other an integer of 0 to 3; and q is an integer of 1 to 5.

The terms, "alkyl", "alkoxy" and other substituents including the "alkyl" part, described herein, include all forms of straight chain and branched chain. In addition, alkyl, alkoxy and other substituents including the alkyl part may be preferentially a long-chained substituent having 8 or more carbon atoms, and more preferentially a branched chain form, but a straight chain form and a short-chained substituent having 7 or less carbon atoms thereof are also included in an exemplary embodiment of the present invention.

In addition, the term "aryl", described herein is an organic radical derived from an aromatic hydrocarbon by removing one hydrogen, including a single or fused ring system containing appropriately 4 to 7, preferably 5 or 6 ring atoms in each ring, and also including even a form of a plurality or aryls linked by a single bond. The term "heteroaryl" described herein is an organic radical derived from an aromatic hydrocarbon by removing one hydrogen, which may be a monocyclic or polycyclic aromatic hydrocarbon radical containing 3 to 8 ring atoms including one or more heteroatoms selected from the group consisting of B, N, O, S, P(=O), Si and P, and includes a single or fused ring system containing appropriately 3 to 7, preferably 5 or 6 ring atoms in each ring, and also includes even a form of a plurality of heteroaryls being linked by a single bond. Here, the terms, "condensation" and "fusion" described herein may be identically interpreted.

The term "heteroarylene" described herein refers to an organic radical derived from an aromatic hydrocarbon by removing two hydrogens. In addition, the term "fused ring system organic radical" described herein includes a single or fused ring system derived from the above described heteroarylene. Besides, the fused ring system organic radical according to the present invention may be a benzo-fused ring system organic radical, a pyrrole-fused ring system organic radical or the like derived from the heteroarylene described above as being preferably.

A of the repeating unit represented by the above Chemical Formula 1 according to an exemplary embodiment of the present invention may be preferably a benzo-fused ring system organic radical such as benzofuranylene, benzothiophenylene, isobenzofuranylene, benzimidazolylene, benzothiazolylene, benzisothiazolylene, benzisoxazolylene, benzoxazolylene, benzoxadiazolylene, isoindolylene, indolylene, indazolylene, benzothiadiazolylene, quinolylene, isoquinolylene, cinnolinylene, quinazolinylene, quinoxalinylene, carbazolylene, benzocarhazolylene, phenanthridinylene, benzodioxolylene, dibenzofuranylene, dibenzothiophenylene, thiadiazolopyridinylene and thiadiazolonaphthothiadiazolylene, or a pyrrole-fused ring system organic radical such as pyrroloimidazolylene, pyrrolopyrazolylene and pyrrolopyrrolidonylene, in terms of having a high molecular extinction coefficient and a broad absorption wavelength, and the fused ring system organic radical may be further substituted by one or more substituents selected from the group consisting of halogen, hydroxy, cyano, (C1-C7)alkyl, (C1-C7)alkoxy, (C6-C12)aryl, (C6-C12)ar(C1-C7)alkyl and the like.

Specifically, A of the repeating unit represented by the above Chemical Formula 1 may be selected from the group consisting of the following structures, but not limited thereto:

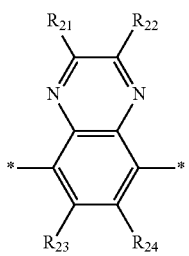

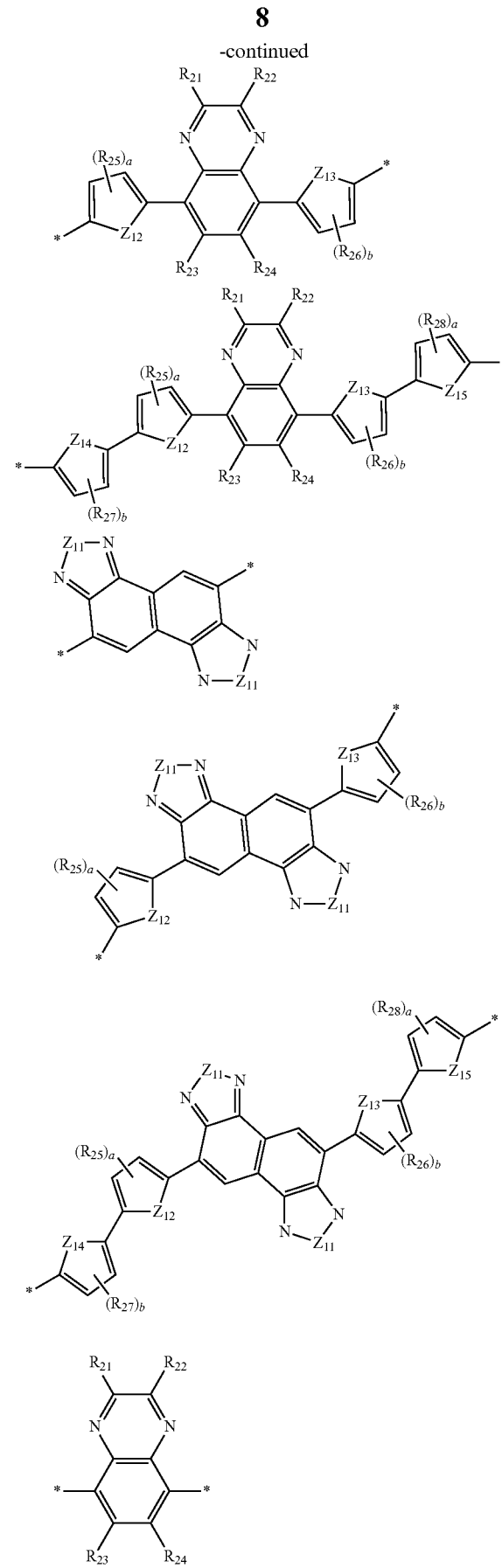

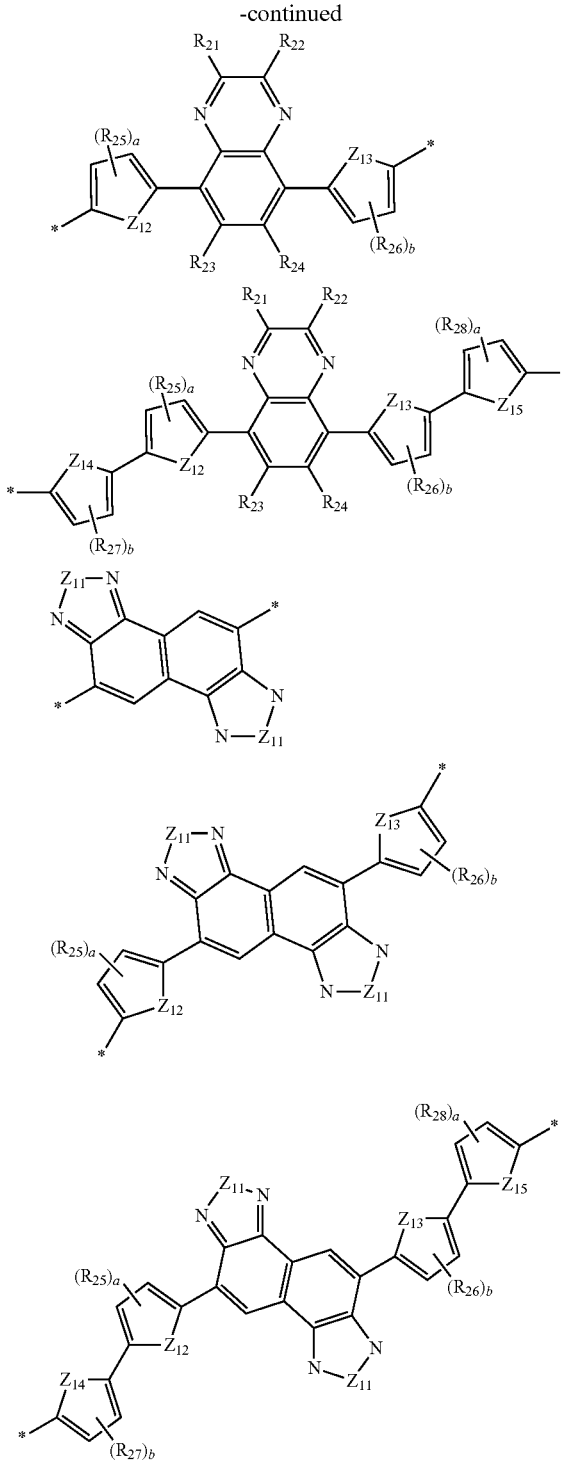
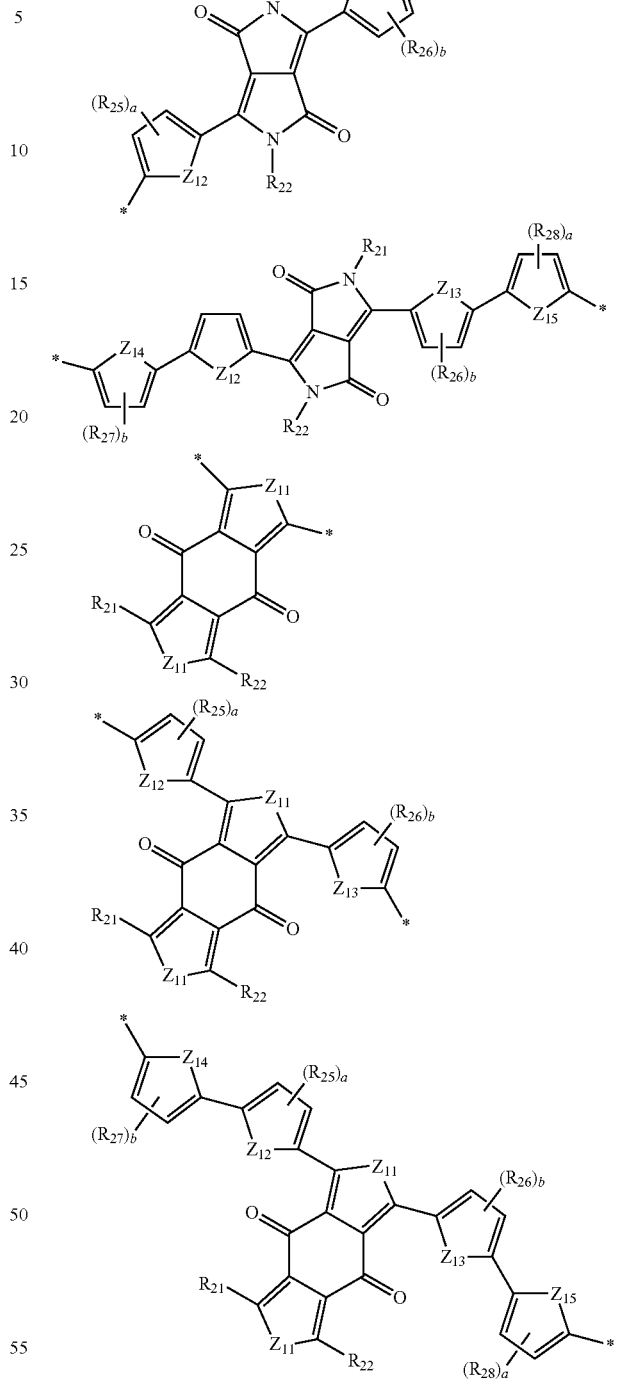
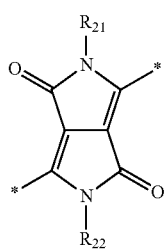
wherein
$Z_{11}$ to $Z_{15}$ are independently of one another O, S or Se;
$R_{21}$ to $R_{24}$ are independently of one another hydrogen, halogen, hydroxy, cyano, (C1-C30)alkyl, (C1-C30)alkoxy, (C6-C30)aryl or (C6-C30)ar(C1-C30)alkyl;
$R_{25}$ to $R_{28}$ are independently of one another halogen, (C1-030)alkyl, (C1-C30)alkoxy, (C6-C30)aryl or (C3-C30)heteroaryl; and a and b are independently of each other an integer of 0 to 2, and when a and b are 2, $R_{25}$ to $R_{28}$ are identical to or different from each other.

In addition, $Z_1$ to $Z_4$ of the polymer according to an exemplary embodiment of the present invention may be independently of one another O or S, and they may be more preferably selected from the group consisting of the following structures, in terms of deriving high charge carrier mobility by π-π stacking in a solid phase, thereby implementing a more improved photoelectric conversion property, but of course, not limited thereto:

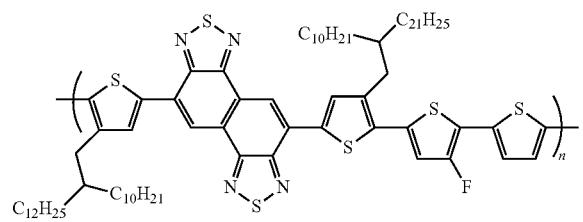

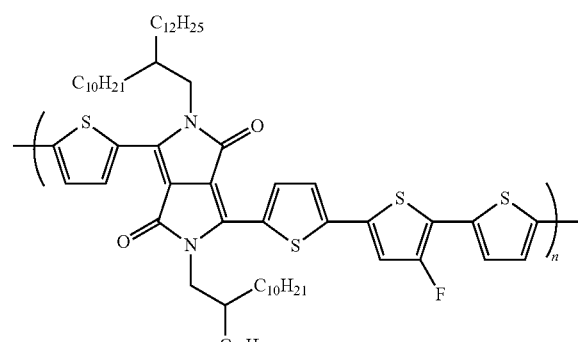

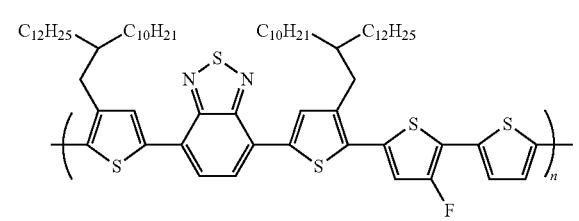

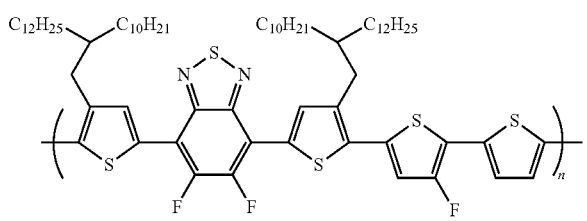

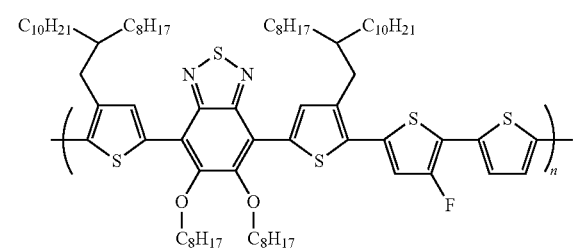

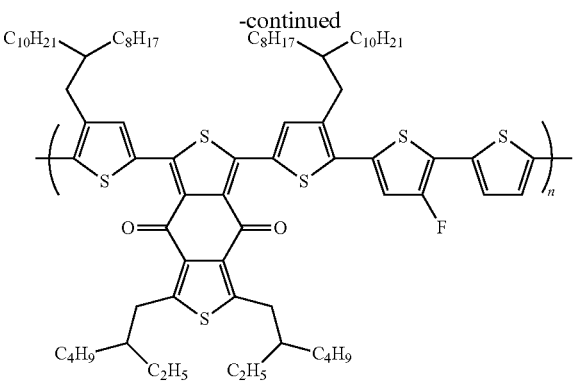

The molecular weight of the polymer according to an exemplary embodiment of the present invention is not limited, but preferably the weight average molecular weight of the polymer may be in a range of 10,000 to 1,000,000.

The present invention provides a method of preparing the above described polymer. Hereinafter, a method of preparing a polymer represented by the following Chemical Formula 3 according to an exemplary embodiment of the present invention will be described, but of course, not limited thereto.

The polymer represented by the following Chemical Formula 3 according to an exemplary embodiment of the present invention may be prepared by reacting a compound represented by the following Chemical Formula 4 and a compound represented by the following Chemical Formula 5:

[Chemical Formula 3]

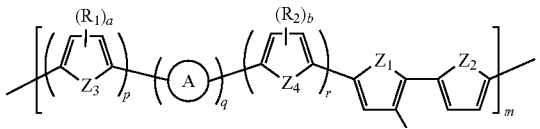

[Chemical Formula 4]

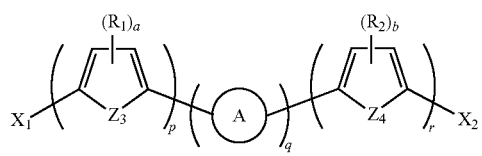

[Chemical Formula 5]

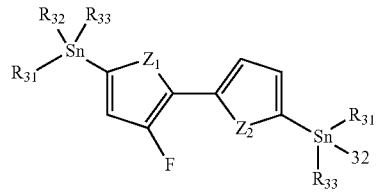

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-C30)heteroaryl;

$R_{31}$ to $R_{33}$ are independently of one another hydrogen or (C1-C30)alkyl;

A is a fused ring system organic radical of heteroarylene selected from the group consisting of furylene, thiophenylene, pyrrolylene, imidazolylene, pyrazolylene, triazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene, pyridazinylene and the like, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —Si— and P;

$X_1$ and $X_2$ are independently of each other halogen;

m is an integer selected from 2 to 1,000;

a and b are independently of each other an integer of 0 to 2, and when a and b are 2, $R_1$ and $R_2$ are identical to or different from each other;

p and r are independently of each other an integer of 0 to 3; and q is an integer of 1 to 5.

Further, the compound represented by the above Chemical Formula 5 may be prepared by the following two preparation methods.

First, a preparation method of the following Reaction Formula 1 will be described:

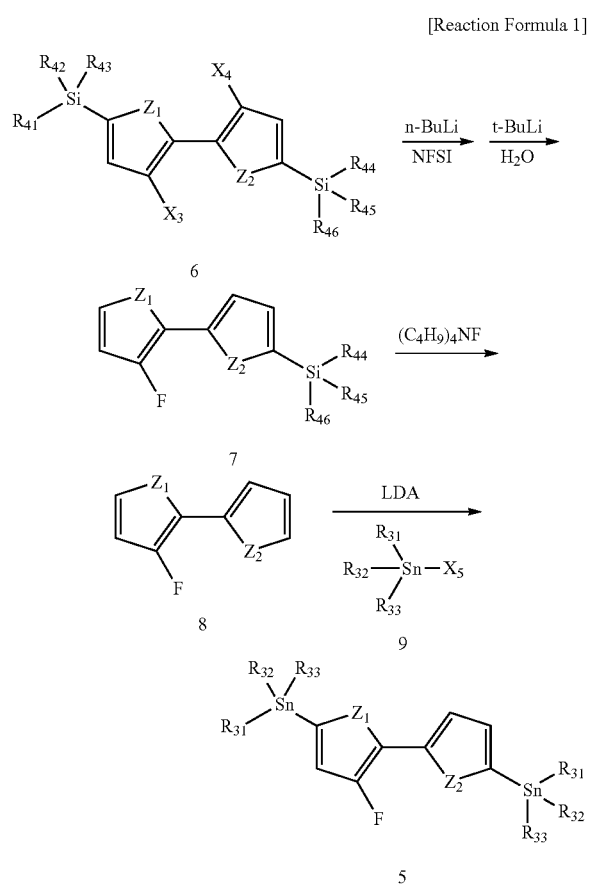

[Reaction Formula 1]

wherein $Z_1$ and $Z_2$ are independently of one another O, S or Se;

$R_{31}$ to $R_{33}$ are independently of one another hydrogen or (C1-C30)alkyl;

$R_{41}$ to $R_{46}$ are independently of one another (C1-C30)alkyl; and $X_3$ to $X_5$ are independently of one another chlorine, bromine or iodine.

The preparation method of Reaction Formula 1 according to an exemplary embodiment of the present invention specifically includes:

using Compound 6 as a starting material and removing one halogen (except fluorine) therefrom with a first metal base, reacting it with a fluorinating agent to introduce one fluorine thereto, and then reacting it with a second metal base to remove a residual halogen (except fluorine), thereby preparing fluorine content-controlled Compound 7; desilylating the Compound 7 to prepare Compound 8; and reacting the Compound 8 with tin halide.

In the preparation method according to an exemplary embodiment of the present invention, a solvent to be used is not limited as long as it is a common organic solvent, however, may be one or more selected from the group consisting of methyl formamide (DMF), ethanol, diisopropyl ether, diethyl ether, dioxane, tetrahydrofuran (THF), dimethyl acetamide (DMA), dimethyl sulfoxide (DMSO), methylene chloride (MC), chlorobenzene, toluene, benzene and the like.

Further, in the preparation method according to an exemplary embodiment of the present invention, a reaction temperature may be the temperature used in a common organic synthesis, but vary depending on reaction materials and an amount of a starting material, and the reaction is completed after confirming by TLC and the like that the starting material is completely consumed. When the reaction is completed, the solvent is distilled under reduced pressure after an extraction process, and then a desired material may be separated and purified by a typical method such as column chromatography.

In the preparation method according to an exemplary embodiment of the present invention, the first metal base is characterized by controlling a reaction condition so that only one fluorine is substituted on a specific position of Compound 6. Here, in order to obtain a desired compound with a high yield, the kind of first metal base, an addition rate and the like may be properly controlled, of course, and a fluorinating agent is further added thereto. Here, the first metal base and the fluorinating agent are used at a range of 1.0 to 1.1 mol, based on Compound 6 (1 mol).

When fluorine is substituted, the first metal base is added at −80 to 0° C. under an anhydrous condition, and the reaction is carried out while raising the temperature to room temperature (23° C.). Here, it is preferred that the addition of the first metal base is carried out at a rate of 0.3 to 2 ml/min, but not limited thereto.

After fluorine is substituted, an excess amount of the second metal base may be added under an anhydrous condition to remove residual halogen (except fluorine), at the same time to partially selectively remove a silyl group (protecting group) introduced at both sides.

However, in the case that the selective desilylation reaction is not simultaneously carried out, it is very difficult to separate and purify the desired Compound 7 from the mixture. Thus, in order to effectively separate and purify the desired Compound 7 from the mixture, subsequently carrying out a selective partial desilylation reaction in the presence of a base may be further included, of course.

Here, it is preferred to use one or more selected from the group consisting of sodium carbonate, sodium hydrogen carbonate, potassium carbonate, potassium hydrogen carbonate, triethyl amine, pyridine and the like, as the base.

The metal base according to an exemplary embodiment of the present invention may be one or more alkyl lithiums selected from the group consisting of methyl lithium, n-butyl lithium, t-butyl lithium, phenyl lithium, isopropyl magnesium chloride•lithium chloride and the like. Preferably, the first metal base and the second metal base may be identical to or different from each other, and selected from the group consisting of n-butyl lithium, t-butyl lithium and the like, but not limited thereto.

In addition, the fluorinating agent according to an exemplary embodiment of the present invention may be one or more selected from the group consisting of diethylaminosulfur trifluoride, 1-fluoro-4-hydroxy-1,4-diazonium bicyclo[2.2.2]octane bis(tetrafluoroborate), N-fluoropyridinium pyridine heptafluorodiborate, N-fluorobenzene sulfonimide, N-fluoro-3,3-dimethyl-2,3-hydro-1,2-benzothiazol-1,1-dioxide, N-fluorooxathiazinone dioxide and the like, and preferably one or more selected from the group consisting of N-fluoropyridinium pyridine heptafluorodiborate, N-fluorobenzene sulfonimide, N-fluoro-3,3-dimethyl-2,3-hydro-1, 2-benzothiazol-1,1-dioxide and the like, but not limited thereto.

The desilylation may be carried out using an acid or a fluoride ion. The fluoride ion may be provided from one or more selected from the group consisting of sodium fluoride, tetra-n-butyl aluminum fluoride, pyridine-hydrofluoride, triethylamine-hydrofluoride and the like, but not limited thereto.

Next, a preparation method of the following Reaction Formula 2 will be described:

[Reaction Formula 2]

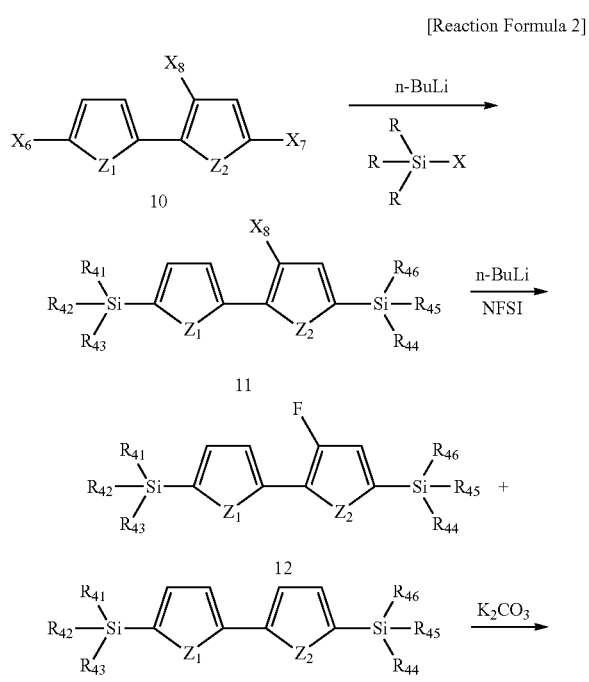

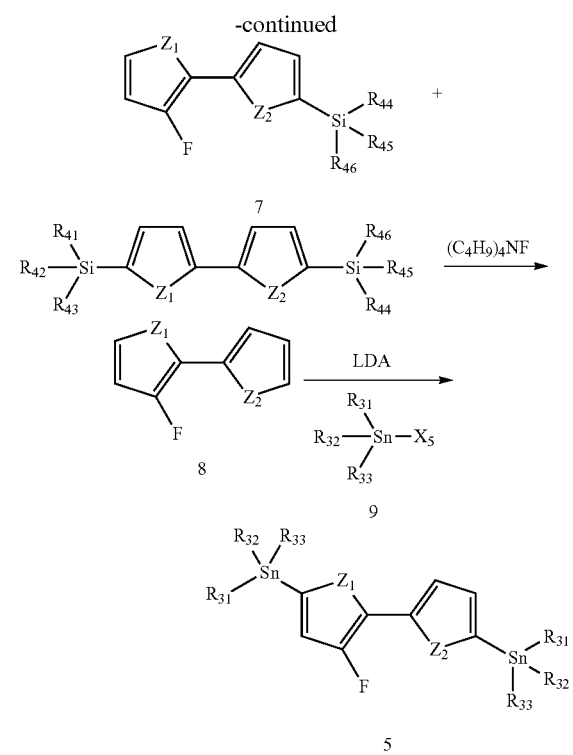

R = alkyl, X = Cl, Br, I wherein $Z_1$ and $Z_2$ are independently of one another O, S or Se;

$R_{31}$ to $R_{33}$ are independently of one another hydrogen or (C1-C30)alkyl;

$R_{41}$ to $R_{46}$ are independently of one another (C1-C30) alkyl; and $X_5$ to $X_8$ are independently of one another chlorine, bromine or iodine.

The preparation method may include using Compound 10 as starting material to carry out a partial silylation reaction to prepare Compound 11; reacting the Compound 11 with a fluorinating agent to prepare Compound 12; selectively partially desilylating the Compound 12 in the presence of a base to prepare Compound 7; desilylating the Compound 7 to prepare Compound 8; and reacting the Compound 8 with a tin halide compound.

When employing the preparation method of Reaction Formula 2, a monomer of a fluorine-controlled repeating unit may be provided with higher selectivity and yield, and thus, it is preferred in the present invention.

The present invention provides an organic optoelectric device including the polymer including the above described fluorine-controlled, specific repeating unit. Here, the organic optoelectric device may be an organic light emitting device, an organic solar cell, an organic photoconductor (OPC), an organic memory, an organic transistor and the like, but not limited thereto.

The organic optoelectric device according to an exemplary embodiment of the present invention may include a first electrode; an organic active layer being disposed on the first electrode and including the polymer; and a second electrode disposed on the organic active layer.

Hereinafter, an organic solar cell according to an exemplary embodiment of the present invention will be described.

The substrate may be a transparent substrate. The transparent substrate may be a glass substrate or plastic substrate, and may be used in the organic solar cell of the present invention or not.

The first electrode may be a transparent electrode, and also, may be a cathode. Specifically, it may be an ITO (indium tin oxide) film, an IO (indium oxide) film, a TO (tin oxide) film, an FTO (fluorinated tin oxide) film, an IZO (indium zinc oxide) film, or a ZO (zinc oxide) film. In addition, a first charge transport layer may be further formed between the first electrode and the organic active layer. In addition, a second charge transport layer may be further formed between the organic active layer and the second electrode. The first charge transport layer may be a hole transport layer. For example, it may be PEDOT:PSS(poly(3,4-ethylenedioxythiophene):poly(styrenesulfonate) layer.

The organic active layer is a layer absorbing light to produce an exciton, may include electron donor and electron acceptor materials, and include the polymer according to the present invention. As it includes the polymer according to the present invention, the crystallinity and hole mobility of the organic active layer is dramatically improved, thereby improving an organic solar cell having excellent power conversion efficiency (PCE). In addition, the organic active layer may be a bulk heterojunction (BHJ) layer in which an electron donor material and an electron acceptor material are mixed with each other. On the contrary to this, of course, the organic active layer may include an electron donor material layer and an electron acceptor material layer which are laminated in turn. The electron donor material may be a polymer including the fluorine-controlled repeating unit of the above Chemical Formula 2 according to the present invention, representatively a polymer represented by Chemical Formula 3, and the electron acceptor material may be a fullerene derivative or a non-fullerene-based monomolecular or high molecular material having a deeper LUMO level than the electron donor. The organic active layer may be formed by dissolving the electron donor material and the electron acceptor material in a solvent, and then using a solution process. For example, the solvent may be one or more selected from the group consisting of chloroform, chlorobenzene, dichlorobenzene, toluene, xylene, trimethylbenzene and the like. With the solvent, a solvent selected from the group consisting of 1,8-diiodooctane, 1-chloronaphthalene and diphenylether may be mixed as an additive.

In the case that the organic active layer is a bulk heterojunction, the electron donor material to the electron acceptor material may be variously adjusted depending on the properties of a device, and specifically may have a mass ratio of 1:0.5 to 0.5:1. The solution process may be a spin coating method, an ink-jet printing method, a screen printing method or the like, but not limited thereto. Since the organic active layer is formed by using the solution process, expensive vacuum equipment is not needed, thereby lowering a process unit price, and realizing the manufacture of a large area organic solar cell.

Further, the organic active layer formed on a substrate may be heat-treated. As a result, the organic active layer may improve the crystallinity of the electron donor material. The heat treatment is not limited as long as the temperature is 80° C. or more, however, it may be carried out at 80 to 130° C., specifically 80 to 110° C.

The second charge transport layer may be an exciton blocking layer preventing diffusion of unseparated excitons. The exciton blocking layer may be a bathophenanthroline (EPhen) layer.

In addition, the second electrode may be a light reflection electrode, and also, may be an anode. Specifically, the second electrode may be a metal electrode having a work function lower than the first electrode. For example, the second electrode may be an Al film, a Ca film, an Ag film or an Mg film. Specifically, the second electrode may be a double layer of a film of Ca which is a metal having a low work function and a film of Al which is a metal having excellent conductivity, but not limited thereto.

Hereinafter, the present invention will be described in detail in the following Examples, but the claims of the present invention are not limited to those Examples.

(Example 1) Preparation of PDTNTTT-1F

Step 1-A. Preparation of 3-bromo-5,5'-bis(trimethylsilyl)-2,2'-bithiophene

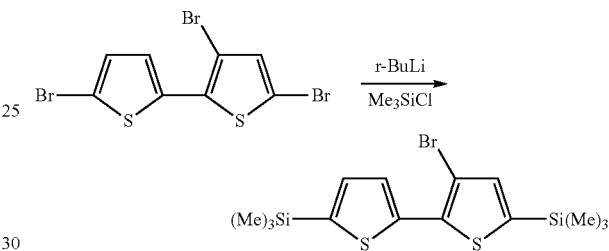

6.0 g of 3,5,5'-tribromo-2,2'-bithiophene (14.9 mmol) was dissolved in 100 ml of an anhydrous THF solvent under the nitrogen atmosphere, then the solution was cooled to −78° C., and 19 ml of 1.6 M n-BuLi (30.5 mmol) was slowly added dropwise to the solution for 10 minutes. The reaction solution was stirred at −78° C. for 1 hour, the temperature was slowly raised to room temperature, and the stirring was carried out again for another 1 hour. Thereafter, the reaction solution was cooled to −78° C. again, and 3.9 ml of trimethylsilyl chloride (30.7 mmol) was added at one time. The reaction solution was slowly heated to room temperature, and stirred for 15 hours. 50 ml of water was added to the reaction solution to stop the reaction, and extraction was carried out twice with a hexane solution, then anhydrous MgSO$_4$ was added to the extracted solution to remove moisture, and the solvent was removed under reduced pressure. Thereafter, a silica gel column using hexane as a solvent was used to obtain 4.70 g of 3-bromo-5,5'-bis(trimethylsilyl)-2,2'-bithiophene (yield 81%).

$^1$H-NMR (400 Hz, CDCl$_3$, ppm): δ 7.52 (1H, d, J=4 Hz), 7.21 (1H, d, J=4 Hz), 7.11 (1H, s), 0.36 (9H, s), 0.34 (9H, s).

$^{13}$C-NMR (100 Hz, CDCl$_3$, ppm): δ 141.8; 140.0; 139.9; 138.5; 137.4; 134.6; 128.0; 109.1.

Step 1-B. Preparation of 3-fluoro-5,5'-bis(trimethylsilyl)-2,2'-bithiophene

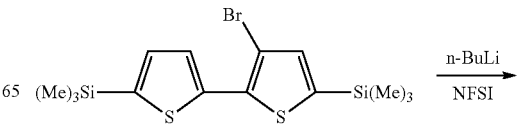

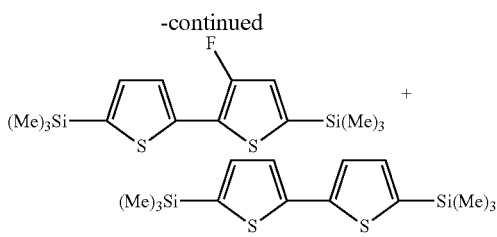

4.70 g of 3-bromo-5,5'-bis(trimethylsilyl)-2,2'-bithiophene (12.06 mmol) obtained in Step 1-A of Example 1 was dissolved in 100 ml of an anhydrous THF solvent under the argon atmosphere, then the solution was cooled to −78° C., 9.8 ml of 1.6 M n-BuLi (15.7 mmol) was slowly added dropwise to the solution for 10 minutes, and the solution was stirred at the same temperature for 2 hours. 5.57 g of N-fluorobenzene sulfonimide (14.47 mmol) dissolved in 20 ml of anhydrous THT was added to the reaction solution. The reaction solution was slowly heated to room temperature, and then stirred for 15 hours. Water was added to the reaction solution to terminate the reaction, anhydrous $MgSO_4$ was added to an organic layer extracted with hexane twice to remove moisture, and the solvent was removed under reduced pressure. Thereafter, a silica gel column using hexane as a solvent was used to obtain 3.09 g of 3-fluoro-5,5'-bis(trimethylsilyl)-2,2'-bithiophene (yield 78%). At this time, in the case of containing a small amount of 5,5'-bis(trimethylsilyl)-2,2'-bithiophene as the impurity, it is very difficult to separate it from the desired compound (3-fluoro-5,5'-bis(trimethylsilyl)-2,2'-bithiophene), however, this problem was effectively solved by carrying out the following Step 1-C.

$^1$H-NMR (400 Hz, $CDCl_3$, ppm): δ 7.31 (1H, d, J=4 Hz), 7.18 (1H, d, J=4 Hz), 6.96 (1H, s), 0.36 (9H, s), 0.33 (9H, s).

$^{13}$C-NMR (400 Hz, $CDCl_3$, ppm): δ 155.96, 153.31, 140.21, 137.96, 136.79, 134.55, 125.74, 124.27.

Step 1-C. Preparation of 3-fluoro-5'-trimethylsilyl-2,2'-bithiophene

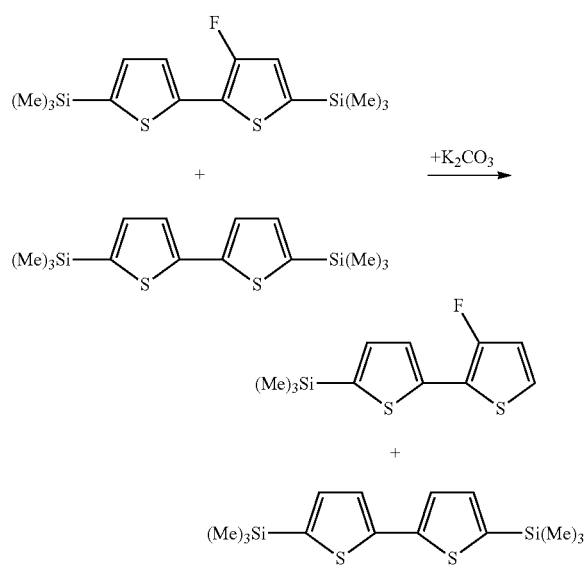

3.09 g of 3-fluoro-5,5'-bis(trimethylsilyl)-2,2'-bithiophene (9.41 mmol) obtained in the above Step 1-B of Example 1 was dissolved in a mixed solvent of 100 ml of THF and 50 ml of methanol in which 2.54 g of anhydrous $K_2CO_3$ (18.35 mmol) is dissolved, and then stirred at room temperature for 8 hours. 100 ml of water was added thereto to dissolve an excess amount of $K_2CO_3$, an organic layer was extracted with hexane, $MgSO_4$ was added to the extracted organic layer to remove moisture, and the solvent was removed under reduced pressure to obtain 2.35 g of 3-fluoro-5'-trimethylsilyl-2,2'-bithiophene (yield 98%) as a light yellow oil form. At this time, a high purity starting material (3-fluoro-5,5'-bis(trimethylsilyl)-2,2'-bithiophene) was used as an initial material, but a small amount of 5,5'-bis(trimethylsilyl)-2,2'-bithiophene may be contained therein as an impurity. However, 5,5'-bis(trimethylsilyl)-2,2'-bithiophene present as an impurity after the reaction may be easily separated and purified through a silica column using 100% hexane as a solvent.

$^1$H-NMR (400 Hz, $CDCl_3$, ppm): δ 7.29 (1H, d, J=4 Hz), 7.17 (1H, m), 6.83 (1H, J=5.6 Hz), 0.34 (9H, s).

$^{13}$C-NMR (400 Hz, $CDCl_3$, ppm): δ 154.8, 152.1, 140.3, 137.6, 134.5, 125.9, 121.6, 118.3.

Step 1-D. Preparation of 3-fluoro-5'-(trimethylsilyl)-2,2'-bithiophene

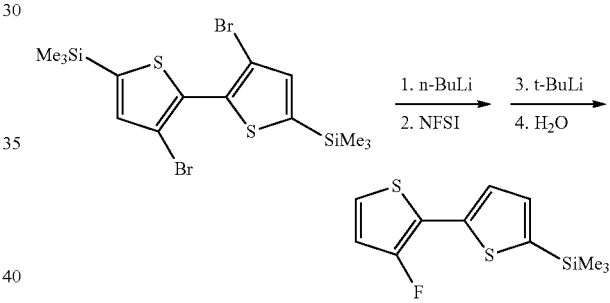

In a 500 ml round flask, 10.0 g of 5,5'-bis(trimethylsilyl)-3,3'-dibromo-2,2'-bithiophene (21.3 mmol) was dissolved in 150 ml of an anhydrous THT solvent under the argon atmosphere, and the solution was cooled to −78° C. 14.0 ml of a 1.6 M n-BuLi solution (22.3 mmol) was added dropwise for 10 minutes, then the solution was stirred for 1 hour, and 6.7 g of N-fluorobenzene sulfonimide (21.3 mmol) dissolved in 30 ml of an anhydrous THF solvent was injected thereinto through a syringe. The reactant was slowly stirred for 15 hours until it was at room temperature (23° C.). 30 ml of water was added to the reaction solution to terminate the reaction, and diethyl ether was extracted with a solvent. The organic layer was dried with anhydrous $Na_2SO_4$, a short silica column was passed therethrough, and the solvent was removed using a rotary evaporator. After the solvent was removed once again in vacuo, the residue was dissolved in 150 ml of an anhydrous THT solvent again, and the solution was cooled to −78° C. 18.8 ml of a 1.7 M t-BuLi solution (32.0 mmol) was added dropwise for 30 minutes, the solution was stirred for 1 hour, and then 10 ml of water was injected thereinto with a syringe to terminate the reaction. The reaction solution was allowed to be at room temperature, and then diethyl ether was extracted with a solvent. The organic layer was dried with anhydrous $Na_2SO_4$, and then the solvent was removed using a rotary evaporator. Separation was carried out using a silica column using a hexane solvent, or distillation was carried out using Kugelrohr equipment, thereby obtaining 2.9 g of 3-fluoro-5'-(trimethylsilyl)-2,2'-bithiophene (yield 53%). At this time, in the case that the silyl group (trimethylsilyl-*) is not selectively removed so that 3-fluoro-5,5'-bis(trimethylsilyl)-2,2'-bithiophene remained, an additional reaction was carried out under the condition of the above Step 1-C, and then a column or Kugelrohr equipment was used, thereby easily separating and purifying the desired compound (3-Fluoro-5'-(trimethylsilyl)-2,2'-bithiophene) therefrom.

$^1$H-NMR (400 MHz, CDCl$_3$): δ (ppm) 7.29 (1H, d, J=3.6); 7.16 (1H, d, J=3.6); 7.05 (1H, dd, J'=3.7, J$^2$=5.6); 6.83 (1H, d, J=5.5); 0.33 (9H, s).

MS (EI): Calcd, 256.0; found M$^+$ 256.

Step 2. Preparation of 3-fluoro-2,2'-bithiophene

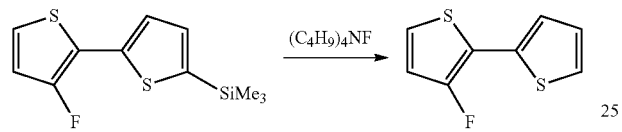

In a 250 ml of round flask, 2.9 g of 3-fluoro-5'-(trimethylsilyl)-2,2'-bithiophene (11.3 mmol) obtained in the above Step 1-C or 1-D of Example 1 was dissolved in 100 ml of anhydrous THF, 15 ml of a 1M tetrabutylammonium fluoride solution (15 mmol) was added thereto at room temperature, and stirring was carried out for 1 hour for reaction. Thereafter, water was added to the reaction solution to terminate the reaction, and then diethyl ether was extracted with a solvent. The organic layer was dried with anhydrous Na$_2$SO$_4$, and then the solvent was removed using a rotary evaporator. 1.85 g of 3-fluoro-2,2'-bithiophene (yield 89%) was obtained through a silica column using a hexane solvent.

$^1$H-NMR (400 MHz, CDCl$_3$): δ (ppm) 7.28 (1H, dd, 5.2, J$^2$=1.1); 7.23 (1H, dd, J=–3.6, J$^2$=1.1); 7.05 (2H, m); 6.84 (1H, d, J=5.6).

$^{13}$C-NMR (400 Hz, CDCl$_3$, ppm): δ 154.8; 152.2; 127.4; 125.0; 124.6; 121.5; 118.3; 118.1.

MS (EI): Calcd, 184.0; found M$^+$ 184.

Step 3. Preparation of 5,5'-bis(trimethylstannyl)-3-fluoro-2,2'-bithiophene

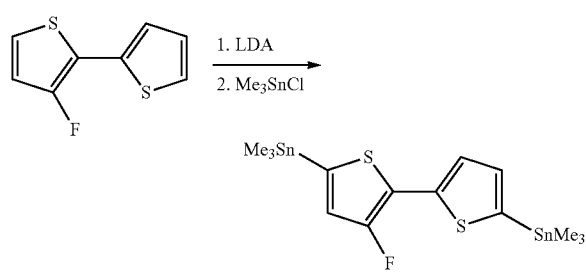

In a 250 ml round flask, 1.85 g of 3-fluoro-2,2'-bithiophene (10.0 mmol) obtained in the above Step 2 of Example 1 was dissolved in 100 ml of an anhydrous THT solvent under the argon atmosphere, and the solution was cooled to −78° C. 10.5 ml of 2M LDA solution (21 mmol) was added dropwise to the solution for 10 minutes, which was then reacted by stirring it for 1 hour, and 22 ml of 1M trimethyl tin chloride (22 mmol) dissolved in a THF solvent was rapidly injected thereinto. The reactant was slowly stirred for 15 hours until it was at room temperature. 30 ml of supersaturated NH$_4$Cl was added to the reaction solution to terminate the reaction, and diethyl ether was extracted with a solvent. An organic layer was washed with water twice, and then dried with anhydrous Na$_2$SO$_4$. After the solvent was removed by a rotary evaporator in vacuo, the residue was recrystallized in methanol to obtain 3.1 g of 5,5'-bis(trimethylstannyl)-3-fluoro-2,2'-bithiophene (yield 61%).

$^1$H-NMR (400 MHz, CDCl$_3$): δ (ppm) 7.32 (1H, d, J=3.3); 7.11 (1H, d, J=3.4); 6.88 (1H, d, J=1.3); 0.38 (18H, m).

$^{13}$C-NMR (400 Hz, CDCl$_3$, ppm): δ 156.1; 153.5; 138.4; 137.4; 135.5; 134.7; 125.5; 125.2.

$^{19}$F-NMR (470 MHz, CDCl$_3$): δ (ppm) −131.26.

MS (EI): Calcd, 509.9; found M$^+$ 510.

Step 4. Preparation of PDTNTTT-1F

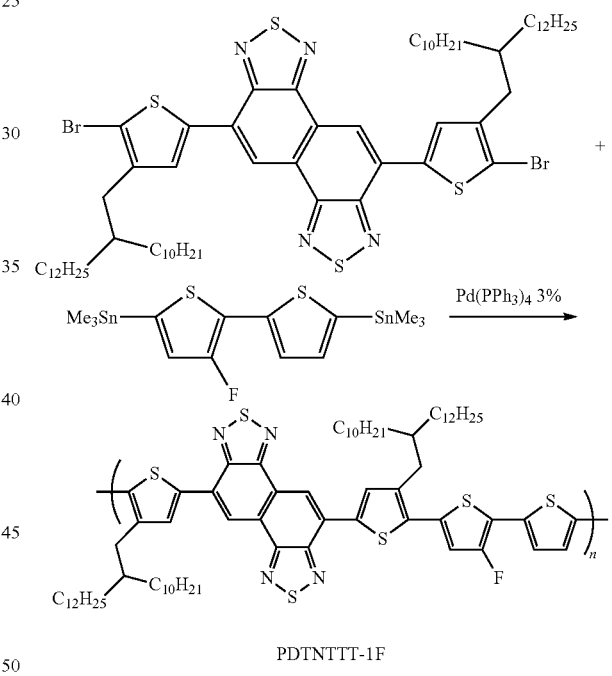

PDTNTTT-1F

To a 25 ml two-neck flask equipped with a condenser in a globe box filled with argon, 248 mg of 5,10-bis(5-bromo-4-(2-decyltetradecyl)thiophen-2-yl)naphtho[1,2-c:5,6-c']bis[1,2,5]thiadiazole (0.20 mmol) obtained in the above Step 3 of Example 1, 102 mg of 5,5'-bis(trimethylstannyl)-3-fluoro-2,2'-bithiophene (0.20 mol), and 7 mg of Pd(PPh$_3$)$_4$ (6 μmol) were added. 8 ml of anhydrous toluene and 2 ml of anhydrous DMF were injected thereinto with a syringe, and reaction was carried out for hours while maintaining 120° C. under the nitrogen atmosphere. The solid obtained by being precipitated from the reaction solution in a methanol solvent and then filtered was dissolved in a small amount of chlorobenzene, and then secondarily reprecipitated in methanol. The precipitate was added to Soxhlet extraction paper, and washed with methanol and dichloromethane, and then extraction was carried out with chloroform and chlorobenzene sequentially. From the solutions extracted with chloroform and chlorobenzene, the solvent was removed respectively so that the amount thereof became small, and then solid was precipitated from the residual solutions in acetone, and dried in vacuo for 24 hours, thereby obtaining 50 mg (extracted with chloroform) and 184 mg (extracted with chlorobenzene) of PDTNTTT-1F high molecules. The molecular weight of the extract with chloroform was able to be confirmed by GPC as follows, but the molecular weight of the extract with chlorobenzene was not able to be measured, since the molecular weight of chloroform in GPC was too high to be dissolved in the solvent.

GPC: $M_n$ (217.1 kDa), $M_w$ (583.4 kDa), PDI (2.69).

(Example 2) Preparation of PDPPTT-1F

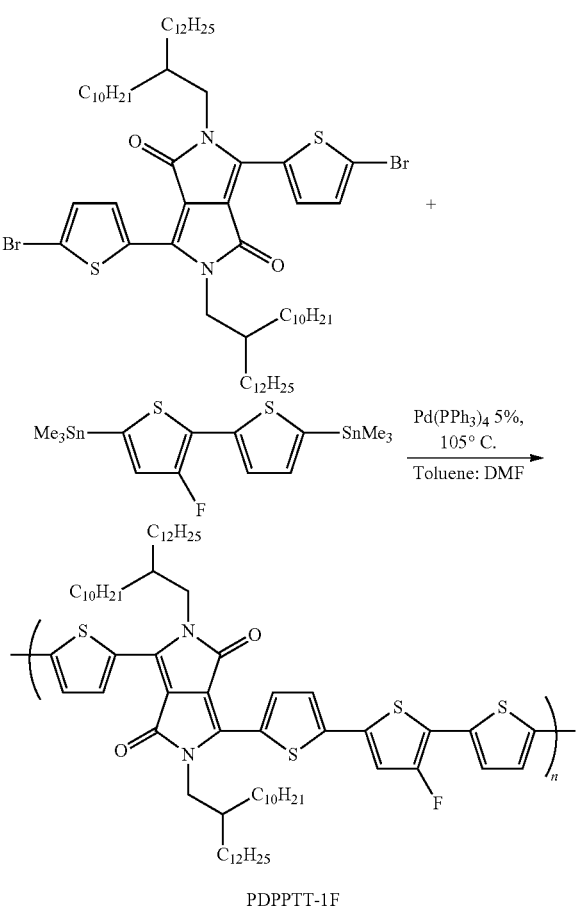

PDPPTT-1F

To a 25 ml two-neck flask equipped with a condenser in a globe box filled with argon, 305 mg of 3,6-bis(5-bromothienyl)-2,5-bis(2-decyltetradecyl) pyrrolo[3,4-c]pyrrole-1,4-dione (0.27 mmol), 138 mg of 5,5'-bis(trimethylstannyl)-3-fluoro-2,2'-bithiophene (0.27 mol), and 9.3 mg of Pd(PPh$_3$)$_4$ (8.1 µmol) were added. 10 ml of anhydrous toluene and 2.5 ml of anhydrous DMF were injected thereinto with a syringe, and reaction was carried out for 24 hours while maintaining 105° C. under the nitrogen atmosphere. The solid obtained by being precipitated from the reaction solution in a methanol solvent and then filtered was dissolved in a small amount of chlorobenzene, and then secondarily reprecipitated in methanol. The precipitate was added to Soxhlet extraction paper, and washed with methanol and dichloromethane, and then extraction was carried out with chloroform. The solvent was removed from the extracted solution so that the amount of the solvent became small, solid was precipitated from the residual solution in acetone, and dried in vacuo for 24 hours, thereby obtaining 284 mg of a PDPPTT-1F high molecule.

GPC: $M_n$ (152.6 kDa), $M_w$ (241.8 kDa), PDI (1.58).

(Comparative Example 1) Preparation of PDTNTTT

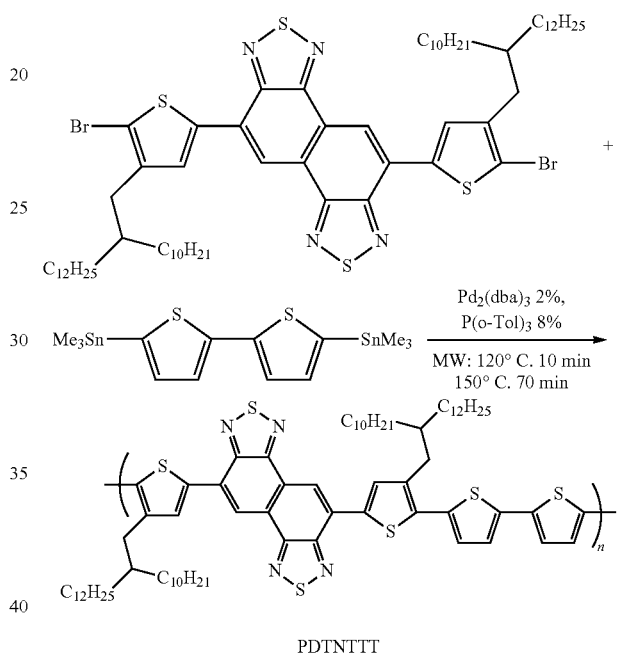

PDTNTTT

To a 5 ml microwave reaction tube in a globe box filled with argon, 124 mg of 5,10-bis(5-bromo-4-(2-decyltetradecyl)thiophen-2-yl)naphtho[1,2-c:5,6-c']bis[1,2,5]thiadiazole (0.10 mmol), 49 mg of 5,5'-bis(trimethylstannyl)-2,2'-bithiophene (0.10 mol), 1.8 mg of Pd$_2$(dba)$_3$ (2 µmol), and 2.4 mg of P(o-Tol)$_3$ (8 µmol) were added. After closing the cap, 2 ml of anhydrous chlorobenzene was injected thereinto using a syringe, the reaction tube was placed in the microwave reactor, and the reaction was carried out at 150° C. for 70 minutes. The solid obtained by being precipitated from the reaction solution in a methanol solvent and then filtered was added to Soxhlet extraction paper, and washed with methanol and dichloromethane, and extraction was carried out with chloroform and chlorobenzene sequentially. The solvent was removed from the extracted solution so that the amount of the solvent became small, solid was precipitated from the residual solution in acetone, and dried in vacuo for 24 hours, thereby obtaining 101 mg (extracted with chloroform) and 11 mg (extracted with chlorobenzene) of a PDTNTTT high molecules.

GPC: $M_n$ (105.0 kDa), $M_w$ (375.6 kDa), PDI (3.58).

(Comparative Example 2) Preparation of PDTNTTT-2F

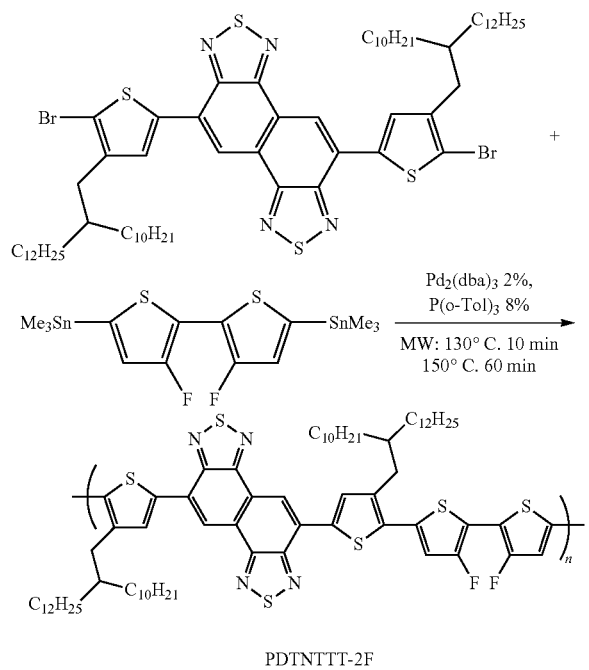

PDTNTTT-2F

To a 5 ml microwave reaction tube in a globe box filled with argon, 124 mg of 5,10-bis(5-bromo-4-(2-decyltetradecyl)thiophen-2-yl)naphtho[1,2-c:5,6-c']bis[1,2,5]thiadiazole (0.10 mmol), 53 mg of 5,5'-bis(trimethylstannyl)-3,3'-difluoro-2,2'-bithiophene (0.10 mol), 1.8 mg of Pd$_2$(dba)$_3$ (2 μmol), and 2.4 mg of P(o-Tol)$_3$ (8 μmol) were added. After closing the cap, 2 ml of anhydrous chlorobenzene was injected thereinto using a syringe, the reaction tube was placed in the microwave reactor, and the reaction was carried out at 130° C. for 10 minutes and at 150° C. for 60 minutes. The solid obtained by being precipitated from the reaction solution in a methanol solvent and then filtered was added to Soxhlet extraction paper, and washed with methanol and dichloromethane, and extraction was carried out with chloroform. The solvent was removed from the extracted solution so that the amount of the solvent became small, solid was precipitated from the residual solution in acetone, and dried in vacuo for 24 hours, thereby obtaining 118 mg of a PDTNTTT-2F high molecule.

GPC: M$_n$ (152.5 kDa), M$_w$ (528.0 kDa), PDI (3.46).

(Comparative Example 3) Preparation of PDPPTT

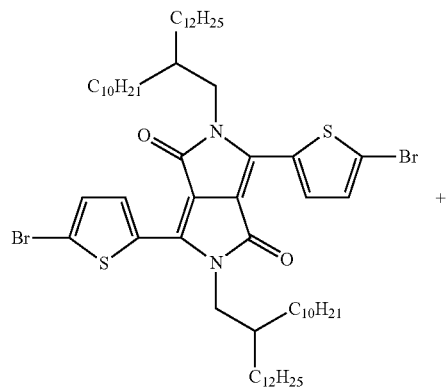

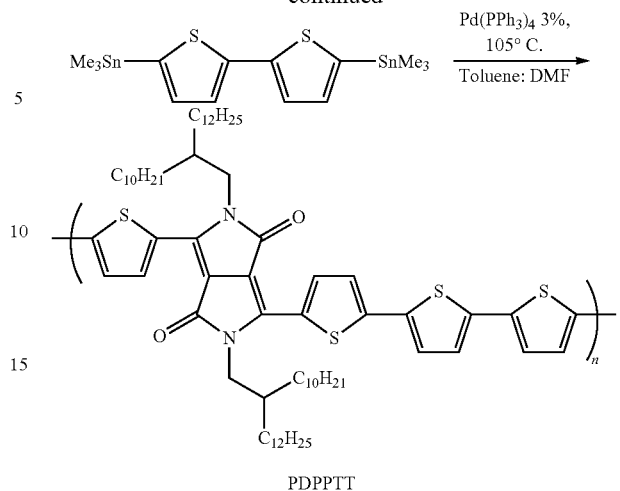

PDPPTT

To a 25 ml two-neck flask equipped with a condenser in a globe box filled with argon, 226 mg of 3,6-bis(5-bromothienyl)-2,5-bis(2-decyltetradecyl) pyrrolo[3,4-c]pyrrole-1,4-dione (0.20 mmol), 98 mg of 5,5'-bis(trimethylstannyl)-2,2'-bithiophene (0.20 mol), and 7 mg of Pd(PPh$_3$)$_4$ (6 μmol) were added. 8 ml of anhydrous toluene and 3 ml of anhydrous DMF were injected thereinto with a syringe, and reaction was carried out for 24 hours while maintaining 105° C. under the nitrogen atmosphere. The solid obtained by being precipitated from the reaction solution in a methanol solvent and then filtered was dissolved in a small amount of chlorobenzene, and then secondarily reprecipitated in methanol. The precipitate was added to Soxhlet extraction paper, and washed with methanol and dichloromethane, and then extraction was carried out with chloroform. The solvent was removed from the extracted solution so that the amount of the solvent became small, solid was precipitated from the residual solution in acetone, and dried in vacuo for 24 hours, thereby obtaining 218 mg of a PDPPTT high molecule.

GPC: M$_n$ (91.1 kDa), M$_w$ (153.4 kDa), PDI (1.68).

(Comparative Example 4) Preparation of PDPPTT-2F

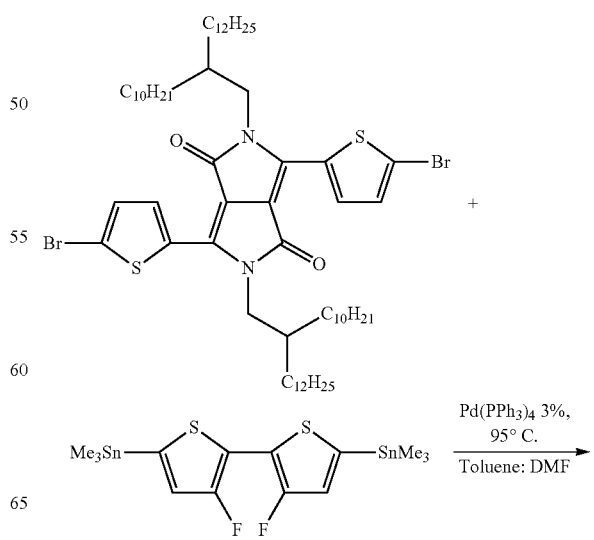

-continued

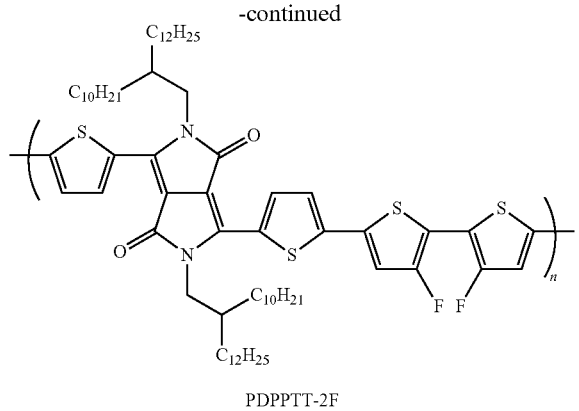

PDPPTT-2F

To a microwave reaction tube in a globe box filled with argon, 226.3 mg of 3,6-bis(5-bromothienyl)-2,5-bis(2-decyltetradecyl) pyrrolo[3,4-c]pyrrole-1,4-dione (0.20 mmol), 105.6 mg of 5,5'-bis(trimethylstannyl)-3,3'-difluoro-2,2'-bithiophene (0.20 mol), and 7 mg of $Pd(PPh_3)_4$ (6 μmol) were added. After closing the cap, 4 ml of anhydrous toluene and 1 ml of anhydrous DMF were injected thereinto using a syringe, the reaction tube was placed in the microwave reactor, and the reaction was carried out at 120° C. for 10 minutes and at 150° C. for 60 minutes. The solid obtained by being precipitated from the reaction solution in a methanol solvent and then filtered was added to Soxhlet extraction paper, and washed with methanol and dichloromethane, and extraction was carried out with chloroform and chlorobenzene sequentially. From the solutions extracted with chloroform and chlorobenzene, the solvent was removed respectively so that the amount thereof became small, and then solid was precipitated from the residual solutions in acetone, and dried in vacuo for 24 hours, thereby obtaining 30 mg (extracted with chloroform) and 186 mg (extracted with chlorobenzene) of PDPPTT-2F high molecules. The molecular weight of the extract with chloroform was able to be confirmed by GPC as follows, but the molecular weight of the extract with chlorobenzene was not able to be measured, since the molecular weight of chloroform in GPC was too high to be dissolved in the solvent.

GPC: $M_n$ (249.6 kDa), $M_w$ (1,577.0 kDa), PDI (6.32).

Figure 9:
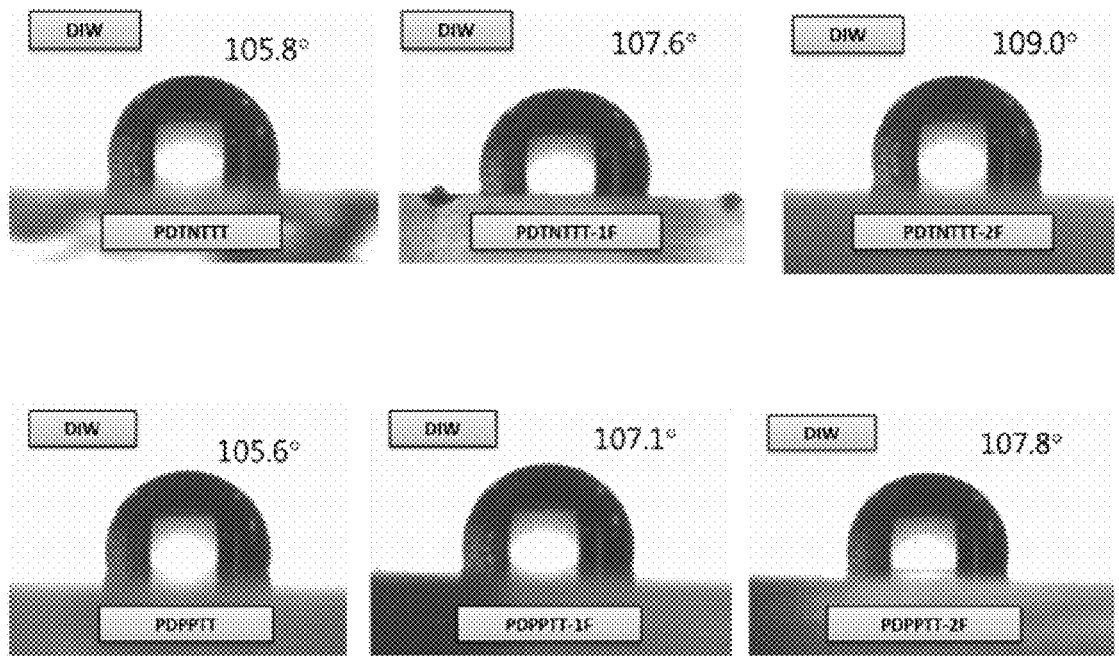
FIG. 9 illustrates water contact angles using the polymers of Examples 1 and 2, and Comparative Examples 1 to 4 of the present invention.

The optical characteristics of the polymer prepared in the above methods were measured, and shown in the following FIGS. 1 to 4. According to the results, the total absorptions were very similar, but as shown in FIG. 9, the polymer containing two fluorines (e.g., PDTNTTT-2F and PDPPTT-2F) had a high water contact angle measured by dropping distilled water, as compared with the polymer containing no fluorine (e.g., PDTNTTT and PDPPTT). That is, it was confirmed that surface energy was significantly reduced by introduction of fluorine. In addition, the polymer according to the present invention, containing one fluorine group by control (e.g., PDTNTTT-1F and PDPPTT-1F) exhibited the intermediate contact angle between those of the polymer containing no fluorine (e.g., PDTNTTT and PDPPTT) and the polymer containing two fluorines (e.g., PDTNTTT-2F and PDPPTT-2F), and thus, it is recognized therefrom that the surface energy has an intermediate value therebetween. That is, it was confirmed that the polymer having the specific repeating unit according to the above description plays an important role in obtaining the most optimized morphology of photoactive materials of donor high molecule and acceptor materials when forming the photoactive layer of an organic solar cell through fine adjustment of surface energy.

Example 3

Manufacture of Organic Solar Cell

A mixture of PDTNTTT-1F and $PC_{71}BM$ (weight ratio of PDTNTTT-1F:$PC_{71}BM$=1:1.5) extracted with chlorobenzene, synthesized in the above Example 1 was used with a solvent of 97/3 (v/v %) xylene/diphenyl ether to prepare a photoactive layer solution. The concentration was adjusted to be 2.0 wt %. An optoelectric device containing each polymer was manufactured so that it has a typical sandwich structure (ITO/ZnO NPs/PEIE/polymer:$PC_{71}BM$/$MoO_3$/Ag). A glass substrate coated with ITO was cleaned by a general cleaning process, sonication in a cleaning agent, and cleaning with distilled water, acetone and 2-propanol. The ITO surface was exposed to UV-ozone for 30 minutes, and then ZnO NPs having a thickness of 30 nm was spin-coated on the ITO substrate. Then, the substrate coated with ZnO NPs was baked on a hot plate at 100° C. for 10 minutes. Next, a PEIE layer having a thickness of 5 nm was coated on the ZnO NPs layer, and in order to evaporate the solvent, heat treatment was carried out on a hot plate at 100° C. for 10 minutes. The dissolved photoactive layer solution was filtered through a PTFE syringe filter, and then spin-coated on the ITO/ZnO NPs/PEIE. In the spin-coating process, the photoactive layer was coated on the substrate, while the temperature of the substrate and the solution was maintained at 100° C. $MoO_3$ having a thickness of 10 nm, and an Ag electrode having a thickness of 100 nm as a top electrode were deposited on a high molecular active layer of the obtained device structure, under the vacuum of $3 \times 10^{-6}$ torr in a thermal evaporator, thereby completing the organic solar cell.

Each photocurrent density-voltage (J-V) characteristic of the organic solar cell manufactured by the above method was measured by a Newport 1000 W solar simulator under lighting simulating sunlight of 100 mW/cm² (AM 1.5 G). The electric data was recorded using a Keithley 236 source-measure unit, and all characteristics were measured under the room temperature atmosphere. The illuminance was corrected by a standard Si photodiode detector from PV measurements Inc., corrected in NREL (National Renewable Energy Laboratory). IPCE (incident photon-to-current conversion efficiency) was measured as a wavelength function in a range of 300 to 900 nm (PV measurement Inc.) provided with a xenon lamp as a light source, and corrected using a silicone standard photodiode. The thickness of a thin film was measured using a KLA Tencor Alpha-step IQ surface profilometer with the accuracy of ±1 nm.

Figure 5:
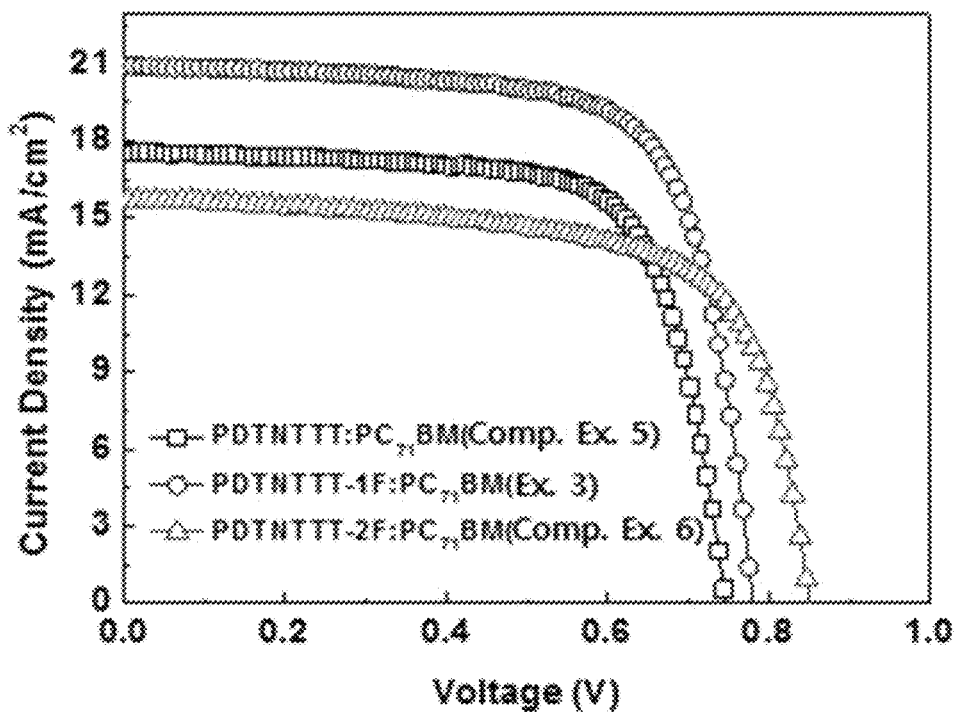
FIG. 5 is a voltage-current density property graph of Example 3, and Comparative Examples 5 and 6 of the present invention.
Figure 6:
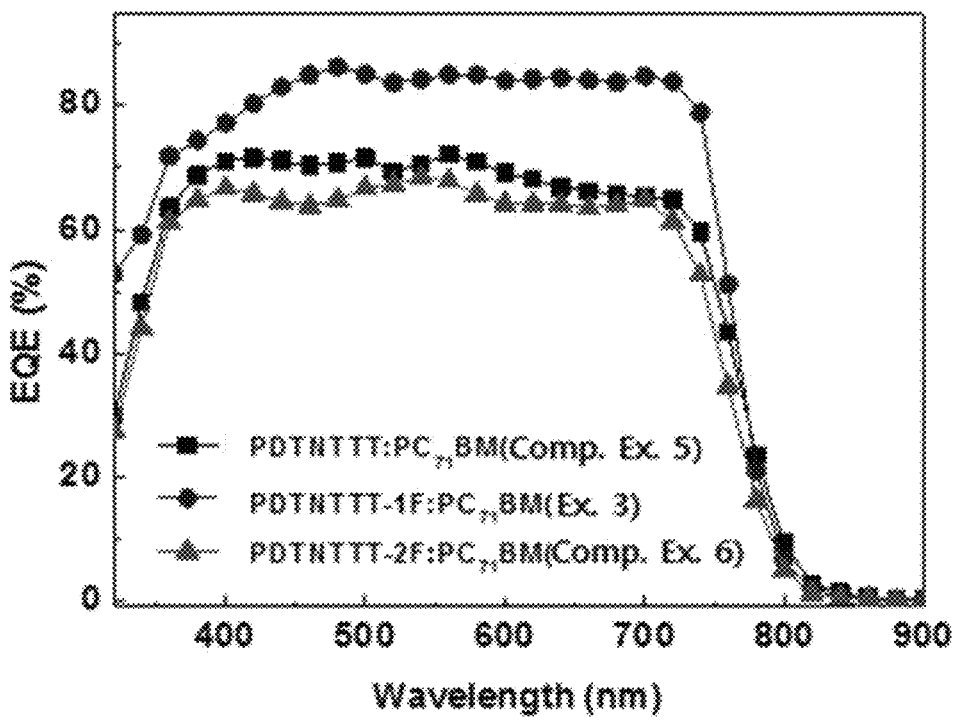
FIG. 6 is an external quantum efficiency graph of Example 3, and Comparative Examples 5 and 6 of the present invention.

The results are summarized in the following Table 1. That is, the photovoltaic parameters of open circuit voltage ($V_{oc}$), short-circuit current density ($J_{SC}$), fill factor (FF), and power conversion efficiency (PCE) are summarized in Table 1. In addition, the voltage-current density characteristic graph and the external quantum efficiency graph of Example 3 are shown in FIGS. 5 and 6.

Among those photovoltaic parameters, the fill factor and the power conversion efficiency were calculated by the following Equations 1 and 2:

Fill factor=$(V_{mp} \times I_{mp})/(V_{oc} \times J_{SC})$ [Equation 1]

wherein $V_{mp}$ is a voltage value at a maximum power point, $I_{mp}$ is current density, $V_{OC}$ is open voltage, and $J_{SC}$ is short-circuit current density;

Power conversion efficiency=(Fill factor)×($J_{SC}$×$V_{oc}$)/100     [Equation 2]

wherein $J_{SC}$ is short-circuit current density, and $V_{OC}$ is open voltage.

Example 4

A photoactive layer solution was prepared in the same manner as in the above Example 3, except that a mixed solution of PDPPTT-1F (PDPPTT-1F extracted with chloroform, synthesized in the above Example 2) instead of PDTNTTT-1F and $PC_{71}BM$ (a weight ratio of PDPPTT-1F:$PC_{71}BM$=1:2) is dissolved in a xylene solvent. At this time, an organic solar cell was completed in the same manner as in Example 3, except that the temperature of the substrate and the solution was maintained at room temperature in the photoactive layer spin coating process.

Figure 7:
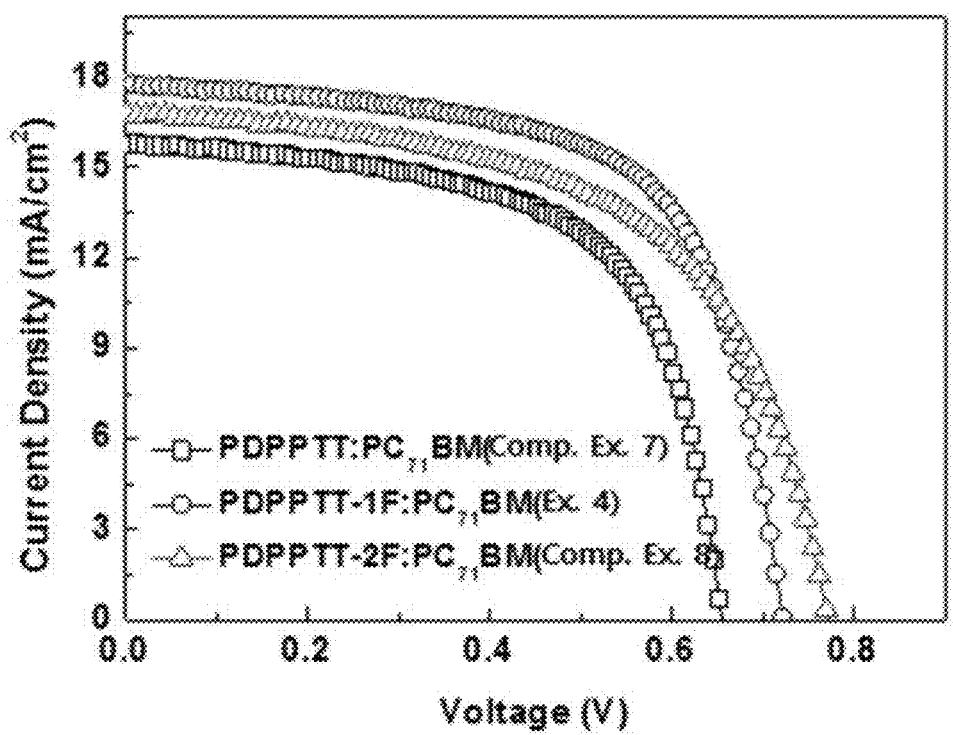
FIG. 7 is a voltage-current density property graph of Example 4, and Comparative Examples 7 and 8 of the present invention.
Figure 8:
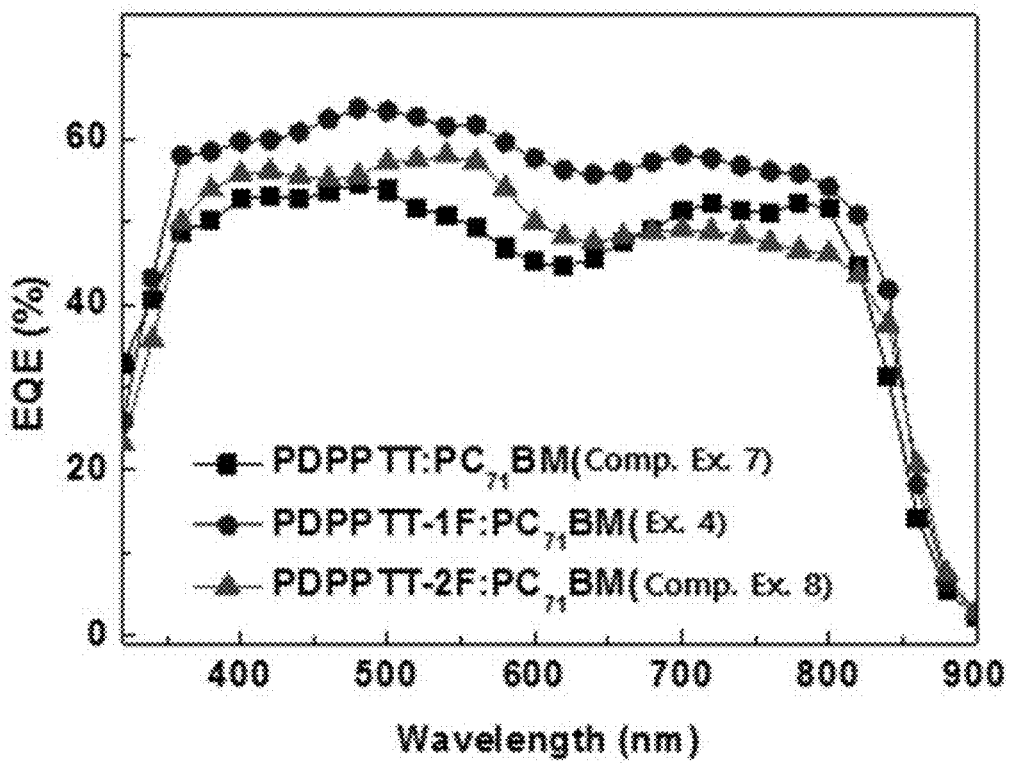
FIG. 8 is an external quantum efficiency graph of Example 4, and Comparative Examples 7 and 8 of the present invention.

The photocurrent density-voltage (J-V) characteristic of each organic solar cell manufactured by the above method was measured, and the results were summarized in the following Table 1. That is, the photovoltaic parameters of open circuit voltage ($V_{oc}$), short-circuit current density ($J_{SC}$), fill factor (FF), and power conversion efficiency (PCE) are summarized in Table 1. In addition, the voltage-current density characteristic graph and the external quantum efficiency graph of Example 4 are shown in FIGS. 7 and 8.

Comparative Examples 5 and 6

An organic solar cell was completed in the same manner as in the above Example 3, except that the solution containing each of Comparative Example 1 (PDTNTTT) or Comparative Example 2 (PDTNTTT-2F) was used instead of the PDTNTTT-1F.

The photocurrent density-voltage (J-V) characteristic of each organic solar cell manufactured by the above method was measured, and the results were summarized in the following Table 1. That is, the photovoltaic parameters of open circuit voltage ($V_{oc}$), short-circuit current density ($J_{SC}$), fill factor (FF), and power conversion efficiency (PCE) are summarized in Table 1. In addition, the voltage-current density characteristic graph and the external quantum efficiency graph of Comparative Examples 5 and 6 are shown in FIGS. 5 and 6.

Comparative Examples 7 and 8

An organic solar cell was completed in the same manner as in the above Example 4, except that the solution containing each of Comparative Example 3 (PDPPTT) and Comparative Example 4 (PDPPTT-2F) was used instead of the PDPPTT-1F.

The photocurrent density-voltage (J-V) characteristic of each organic solar cell manufactured by the above method was measured, and the results were summarized in the following Table 1. That is, the photovoltaic parameters of open circuit voltage ($V_{oc}$), short-circuit current density ($J_{SC}$), fill factor (FF), and power conversion efficiency (PCE) are summarized in Table 1. In addition, the voltage-current density characteristic graph and the external quantum efficiency graph of Comparative Examples 7 and 8 are shown in FIGS. 7 and 8.

TABLE 1

| | $V_{OC}$(V) | $J_{SC}$(mA/cm$^2$) | FF (%) | PCE (%) |
|---|---|---|---|---|
| Example 3 (PDTNTTT-1F) | 0.78 | 20.99 | 72 | 11.71 |
| Example 4 (PDPPTT-1F) | 0.72 | 17.77 | 64 | 8.29 |
| Comparative Example 5 (PDTNTTT) | 0.75 | 17.57 | 72 | 9.42 |
| Comparative Example 6 (PDTNTTT-2F) | 0.85 | 15.73 | 68 | 9.11 |
| Comparative Example 7 (PDPPTT) | 0.66 | 15.78 | 62 | 6.45 |
| Comparative Example 8 (PDPPTT-2F) | 0.77 | 16.77 | 57 | 7.50 |

As shown in the above Table 1, it is recognized that Voc, Jsc, FF, and power conversion efficiency (PCE) were greatly increased as compared with those of the Comparative Examples, by employing the fluorine-controlled polymer according to the present invention. In particular, it is recognized that in terms of the power conversion efficiency, the organic optoelectric device employing the polymer of the present invention exhibited an improved effect of 128% or more at most as compared with those of the organic optoelectric device employing the fluorine-unsubstituted polymer (Example 4 vs. Comparative Example 7), and of 128% or more at most as compared with those of the organic optoelectric device employing the polymer containing an excess amount of fluorine (Example 3 vs. Comparative Example 6).

Therefore, according to the present invention, a novel polymer having a low band gap to provide a highly efficient organic optoelectric device, an excellent crystallization characteristic, and an excellent charge carrier transfer characteristic through the effective intermolecular stacking of a planar molecular structure may be provided by maximizing the power conversion efficiency.

The polymer according to the present invention includes a fluorine-controlled, specific repeating unit, to have a low band gap, have an excellent crystallization property, and improve a charge carrier transfer property through effective intermolecular stacking of a planar molecular structure, thereby eventually providing an organic optoelectric device having excellent power conversion efficiency (PCE).

What is claimed is:

1. A polymer comprising repeating units represented by the following Chemical Formulae 1 and 2:

[Chemical Formula 1]

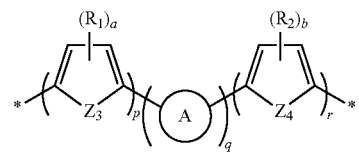

[Chemical Formula 2]

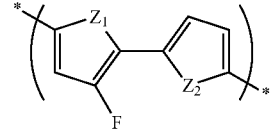

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-C30)heteroaryl;

A is a fused ring system organic radical of heteroarylene selected from the group consisting of furylene, thiophenylene, pyrrolylene, imidazolylene, pyrazolylene, thiazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene and pyridazinylene, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —C(=O)—, —Si— and P;

a and b are independently of each other an integer of 0 to 2, and when a and b are 2, $R_1$ and $R_2$ are identical to or different from each other;

p and r are independently of each other an integer of 0 to 3; and q is an integer of 1 to 5.

2. The polymer of claim 1, wherein A of Chemical Formula 1 is a benzo-fused ring system organic radical selected from the group consisting of benzofuranylene, benzothiophenylene, isobenzofuranylene, benzimidazolylene, benzothiazolylene, benzisothiazolylene, benzisoxazolylene, benzoxazolylene, benzoxadiazolylene, isoindolylene, indolylene, indazolylene, benzothiadiazolylene, quinolylene, isoquinolylene, cinnolinylene, quinazolinylene, quinoxalinylene, carbazolylene, benzocarbazolylene, phenanthridinylene, benzodioxolylene, dibenzofuranylene, dibenzothiophenylene, thiadiazolopyridinylene and thiadiazolonaphthothiadiazolylene, or a pyrrole-fused ring system organic radical selected from the group consisting of pyrroloimidazolylene, pyrrolopyrazolylene and pyrrolopyrrolidonylene, and the fused ring system organic radical may be further substituted by one or more substituents selected from the group consisting of halogen, hydroxy, cyano, (C1-C7)alkyl, (C1-C7)alkoxy, (C6-C12)aryl and (C6-C12)ar(C1-C7)alkyl.

3. The polymer of claim 1, wherein the Chemical Formula 1 is selected from the group consisting of the following structures:

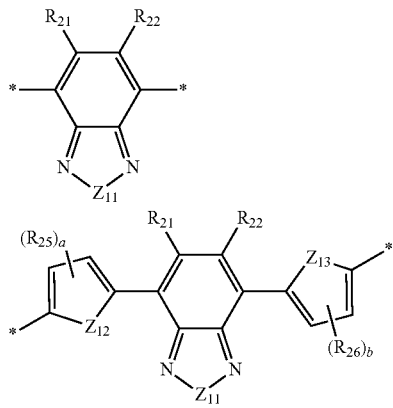

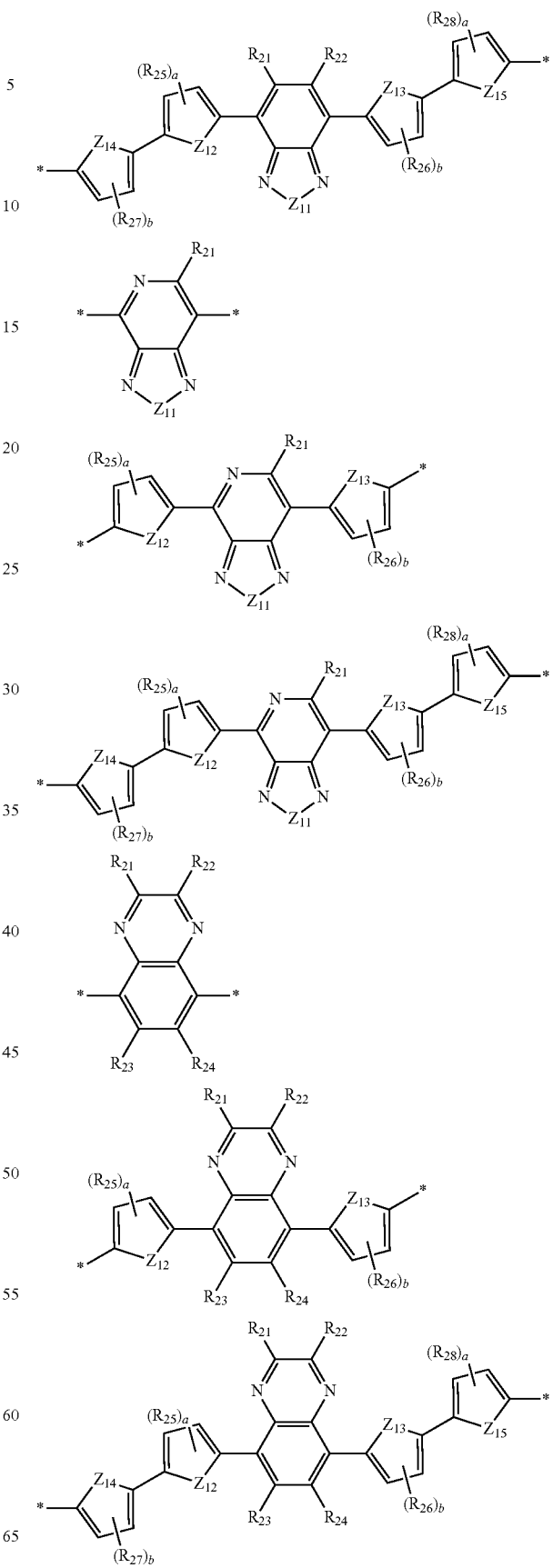

-continued

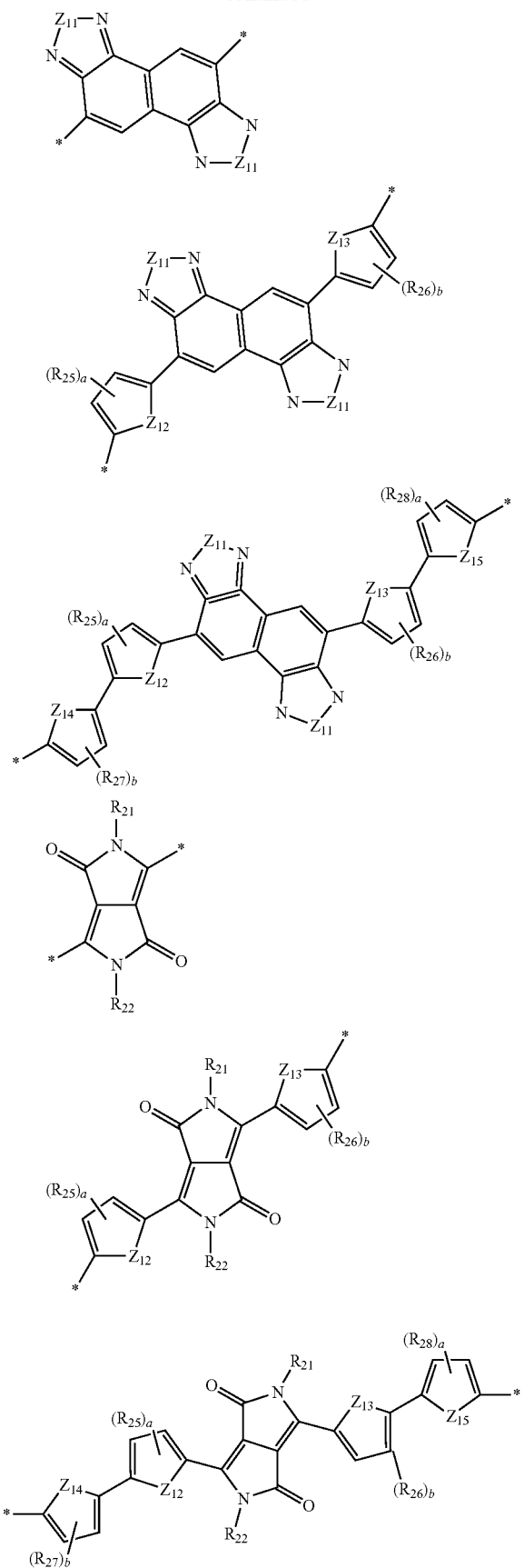

-continued

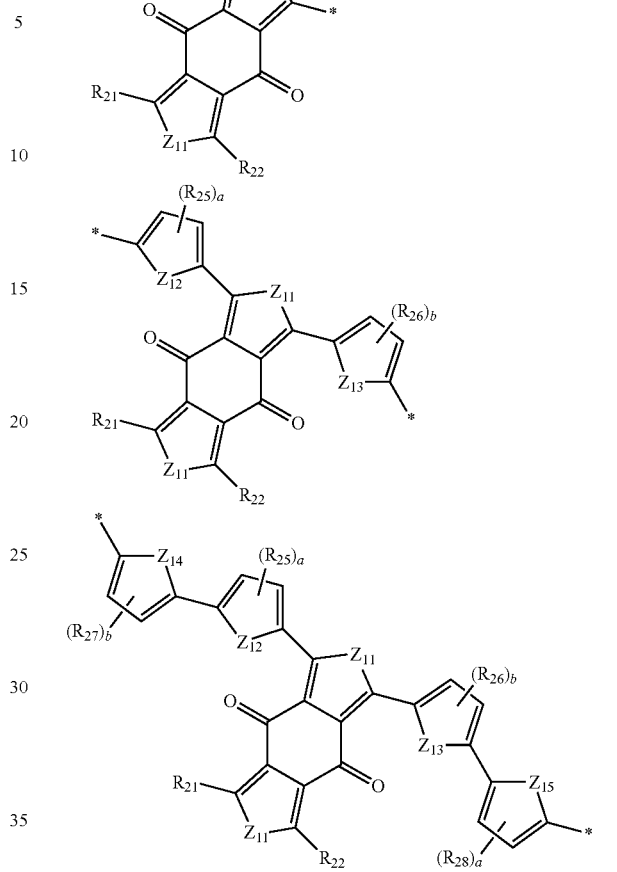

wherein $Z_{11}$ to $Z_{15}$ are independently of one another O, S or Se;

$R_{21}$ to $R_{24}$ are independently of one another hydrogen, halogen, hydroxy, cyano, (C1-O30)alkyl, (C1-C30)alkoxy, (C6-C30)aryl or (C6-O30)ar(C1-C30)alkyl;

$R_{25}$ to $R_{28}$ are independently of one another halogen, (C1-C30)alkyl, (C1-C30)alkoxy, (C6-C30)aryl or (C3-C30)heteroaryl; and a and b are independently of each other an integer of 0 to 2, and when a and b are 2, $R_{25}$ to $R_{28}$ are identical to or different from each other.

4. The polymer of claim 1, wherein $Z_1$ to $Z_4$ are independently of one another O or S.

5. The polymer of claim 1, wherein it has a weight average molecular weight of 10,000 to 1,000,000.

6. A method of preparing a polymer, comprising: reacting a compound represented by the following Chemical Formula 4 and a compound represented by the following Chemical Formula 5 to prepare a polymer represented by the following Chemical Formula 3:

[Chemical Formula 3]

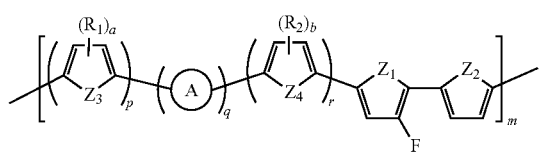

-continued

[Chemical Formula 4]

[Chemical Formula 5]

wherein $Z_1$ to $Z_4$ are independently of one another O, S or Se;

$R_1$ and $R_2$ are independently of each other halogen, (C1-C30)alkyl, (C1-C30)alkoxy, (C6-C30)aryl or (C3-C30)heteroaryl;

$R_{31}$ to $R_{33}$ are independently of one another hydrogen or (C1-C30)alkyl;

A is a fused ring system organic radical of heteroarylene selected from the group consisting of furylene, thiophenylene, pyrrolylene, imidazolylene, pyrazolylene, thiazolylene, thiadiazolylene, isothiazolylene, isoxazolylene, oxazolylene, oxadiazolylene, triazinylene, tetrazinylene, triazolylene, tetrazolylene, furazanylene, pyridylene, pyrazinylene, pyrimidinylene and pyridazinylene, and the fused ring system organic radical may be further substituted by one or more substituents selected from the group consisting of halogen, hydroxy, cyano, (C1-C30)alkyl, (C1-C30)alkoxy, (C6-C30)aryl and (C6-C30)ar(C1-C30)alkyl, and the fused ring system organic radical may contain one or more heteroatoms selected from the group consisting of =B—, =N—, —O—, —S—, —P(=O)—, —Si— and P;

$X_1$ and $X_2$ are independently of each other halogen;

m is an integer selected from 2 to 1,000;

a and b are independently of each other an integer of 0 to 2, and when a and b are 2, $R_1$ and $R_2$ are identical to or different from each other; and p and r are independently of each other an integer of 0 to 3; and q is an integer of 1 to 5.

7. The method of claim 6, wherein the compound represented by Chemical Formula 5 is prepared by:

reacting a compound represented by the following Chemical Formula 6 with a first metal base and n-fluorobenzene sulfonimide, and then adding a second metal base thereto, thereby preparing a fluorine content-controlled compound represented by the following Chemical Formula 7;

desilylating the compound represented by Chemical Formula 7 to prepare a compound represented by the following Chemical Formula 8; and reacting the compound represented by Chemical Formula 8 with a tin halide compound represented by the following Chemical Formula 9:

[Chemical Formula 5]

[Chemical Formula 6]

[Chemical Formula 7]

[Chemical Formula 8]

$S_n(R_{31})(R_{32})(R_{33})X_5$  [Chemical Formula 9]

wherein $Z_1$ and $Z_2$ are independently of one another O, S or Se;

$R_{31}$ to $R_{33}$ are independently of one another hydrogen or (C1-C30)alkyl;

$R_{41}$ to $R_{46}$ are independently of one another (C1-C30) alkyl; and $X_3'$ to $X_5$ are independently of one another chlorine, bromine or iodine.

8. The method of claim 7, wherein after preparing the compound represented by Chemical Formula 7, selectively desilylating the compound in the presence of a base is further included.

9. The method of claim 6, wherein the compound represented by Chemical Formula 5 is prepared by:

partially silylating a compound represented by the following Chemical Formula 10 to prepare a compound represented by the following Chemical Formula 11;

reacting the compound represented by Chemical Formula 11 with a fluorinating agent to prepare a compound represented by the following Chemical Formula 12;

selectively desilylating the compound represented by Chemical Formula 12 in the presence of a base to prepare a compound represented by the following Chemical Formula 7;

desilylating the compound represented by Chemical Formula 7 to prepare a compound represented by the following Chemical Formula 8; and reacting the compound represented by Chemical Formula 8 with a tin halide compound represented by the following Chemical Formula 9:

[Chemical Formula 5]

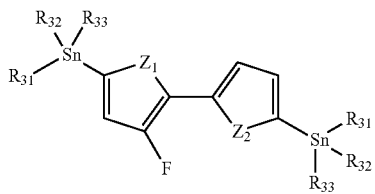

[Chemical Formula 7]

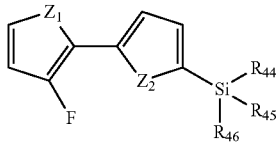

[Chemical Formula 8]

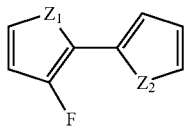

[Chemical Formula 9]

Sn (R$_{31}$) (R$_{32}$) (R$_{33}$) X$_5$

[Chemical Formula 10]

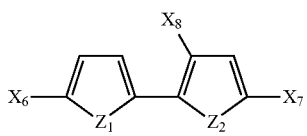

[Chemical Formula 11]

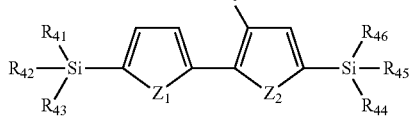

[Chemical Formula 12]

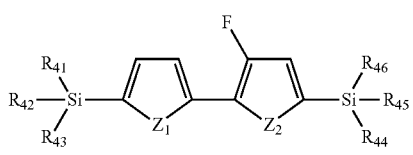

wherein

Z$_1$ and Z$_2$ are independently of one another O, S or Se;

R$_{31}$ to R$_{33}$ are independently of one another hydrogen or (C1-C30)alkyl;

R$_{41}$ to R$_{46}$ are independently of one another (C1-C30) alkyl; and

X$_5$ to X$_8$ are independently of one another chlorine, bromine or iodine.

10. A method of preparing a compound represented by the following Chemical Formula 7, comprising:

partially silylating a compound represented by the following Chemical Formula 10 to prepare a compound represented by the following Chemical Formula 11;

reacting the compound represented by Chemical Formula 11 with a fluorinating agent to prepare a compound represented by the following Chemical Formula 12;

selectively desilylating the compound represented by Chemical Formula 12 in the presence of a base:

[Formula Formula 7]

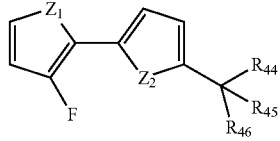

[Chemical Formula 10]

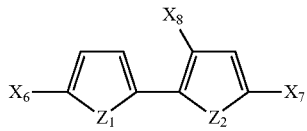

[Chemical Formula 11]

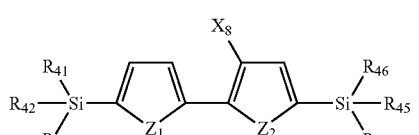

[Chemical Formula 12]

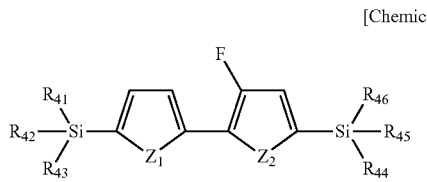

wherein

Z$_1$ and Z$_2$ are independently of one another O, S or Se;

R$_{41}$ to R$_{46}$ are independently of one another (C1-C30) alkyl; and

X$_6$ to X$_8$ are independently of one another chlorine, bromine or iodine.

11. An organic optoelectric device comprising the polymer of claim 1.

* * * * *